(12) United States Patent
Tatsumi

(10) Patent No.: US 12,126,158 B2
(45) Date of Patent: Oct. 22, 2024

(54) BUSBAR ASSEMBLY AND METHOD FOR MANUFACTURING THE SAME

(71) Applicant: SUNCALL CORPORATION, Kyoto (JP)

(72) Inventor: Shota Tatsumi, Kyoto-shi (JP)

(73) Assignee: Suncall Corporation, Kyoto (JP)

( * ) Notice: Subject to any disclaimer, the term of this patent is extended or adjusted under 35 U.S.C. 154(b) by 171 days.

(21) Appl. No.: 17/597,039

(22) PCT Filed: Jun. 12, 2020

(86) PCT No.: PCT/JP2020/023142
§ 371 (c)(1),
(2) Date: Dec. 23, 2021

(87) PCT Pub. No.: WO2020/262030
PCT Pub. Date: Dec. 30, 2020

(65) Prior Publication Data
US 2022/0239086 A1 Jul. 28, 2022

(30) Foreign Application Priority Data

Jun. 25, 2019 (JP) ................... 2019-117512

(51) Int. Cl.
*H02G 5/00* (2006.01)
(52) U.S. Cl.
CPC .................... *H02G 5/005* (2013.01)
(58) Field of Classification Search
CPC ............... H02G 5/002; H02G 5/005
See application file for complete search history.

(56) References Cited

U.S. PATENT DOCUMENTS

2007/0090494 A1*  4/2007  Kimura ............... B21C 1/00
                                                            257/632

FOREIGN PATENT DOCUMENTS

| JP | 06251637 A | 9/1994 |
|---|---|---|
| JP | 4432913 B2 | 3/2010 |
| JP | 2011159837 A | 8/2011 |
| JP | 6487769 B2 | 3/2019 |
| JP | 2019042678 A | 3/2019 |
| JP | 2019050090 A | 3/2019 |
| WO | 2019044687 A1 | 3/2019 |
| WO | 2019049687 A1 | 3/2019 |

OTHER PUBLICATIONS

International Search Report issued in International Application No. PCT/JP2020/023142, mailed Dec. 30, 2020, 4 pages.

* cited by examiner

*Primary Examiner* — Chau N Nguyen
(74) *Attorney, Agent, or Firm* — Sterne, Kessler, Goldstein & Fox P.L.L.C.

(57) ABSTRACT

A busbar assembly of the present invention includes a plurality of busbars disposed in parallel in a common plane with a gap between adjacent busbars, and an insulative resin layer including a gap filling part and a first surface-side laminate part, the first surface-side laminate part having a plurality of first surface-side center openings that expose predetermined parts of first surfaces of the plurality of busbars respectively to form a plurality of exposure regions, the insulative resin layer being formed by an insulative resin material that is transparent in a half-cured state and non-transparent in a completely cured state.

15 Claims, 21 Drawing Sheets

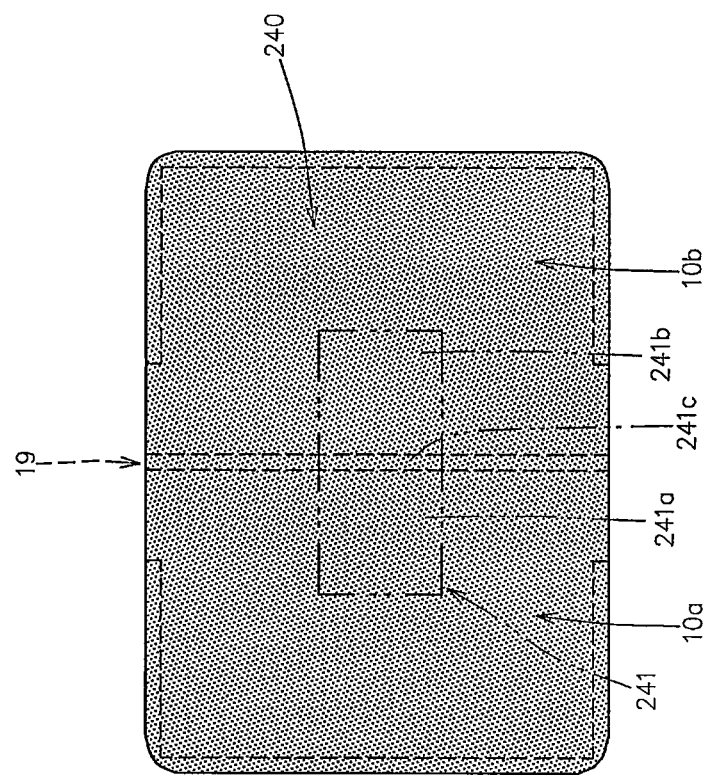

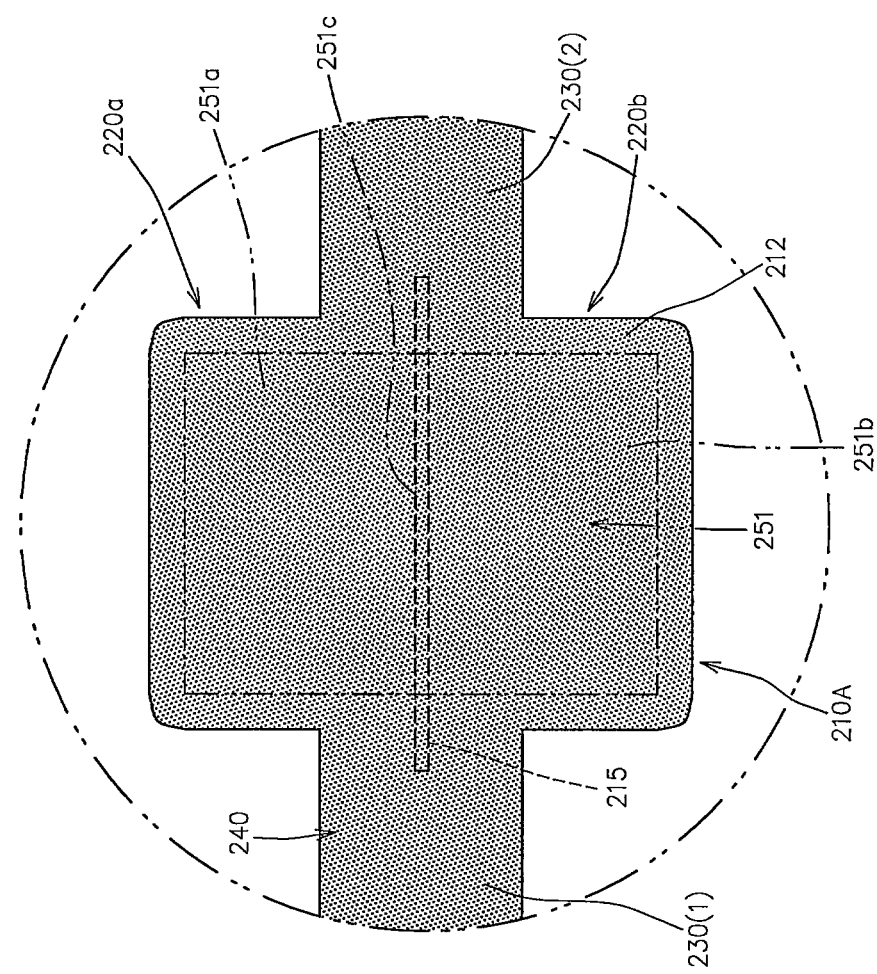

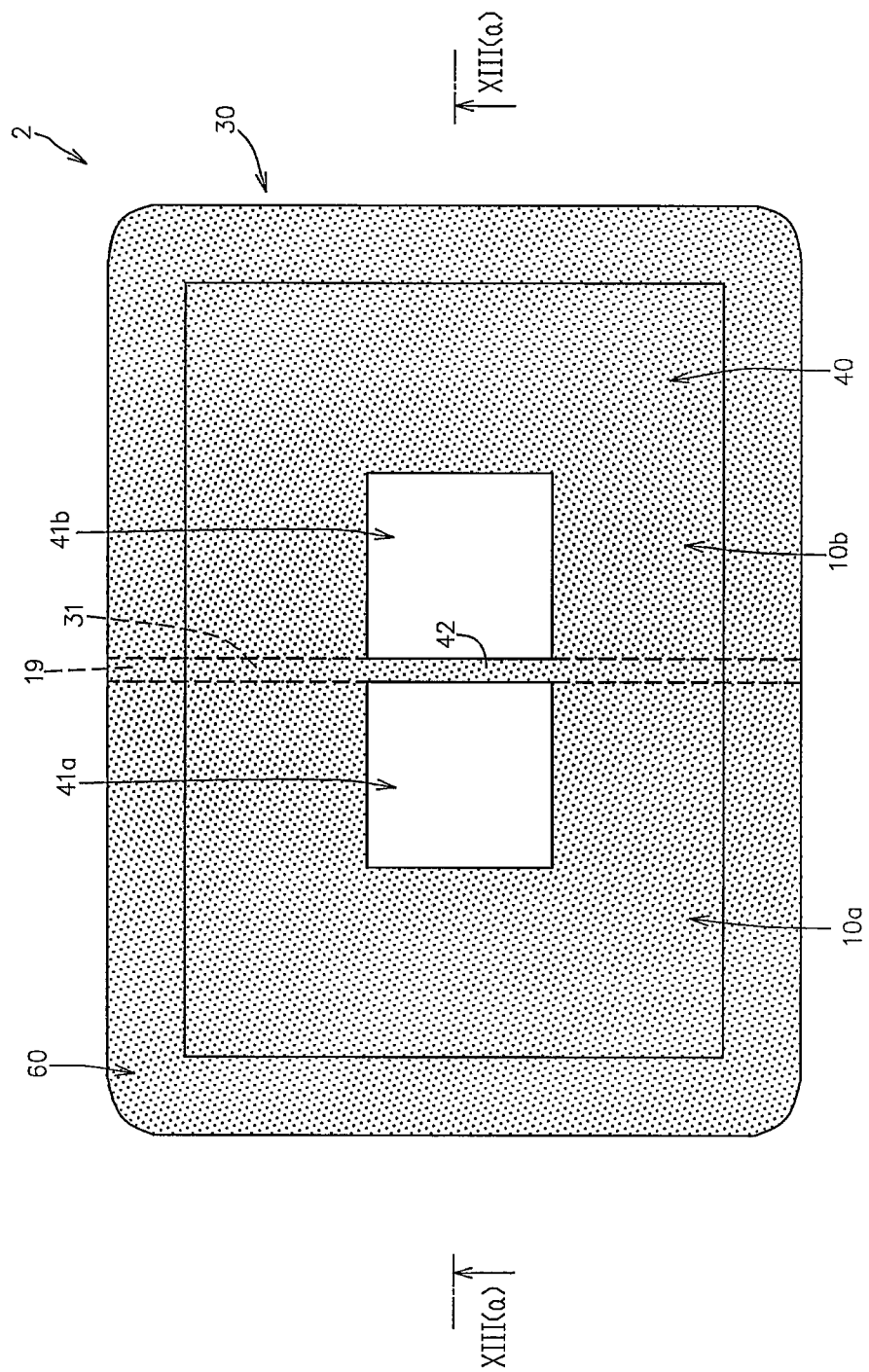

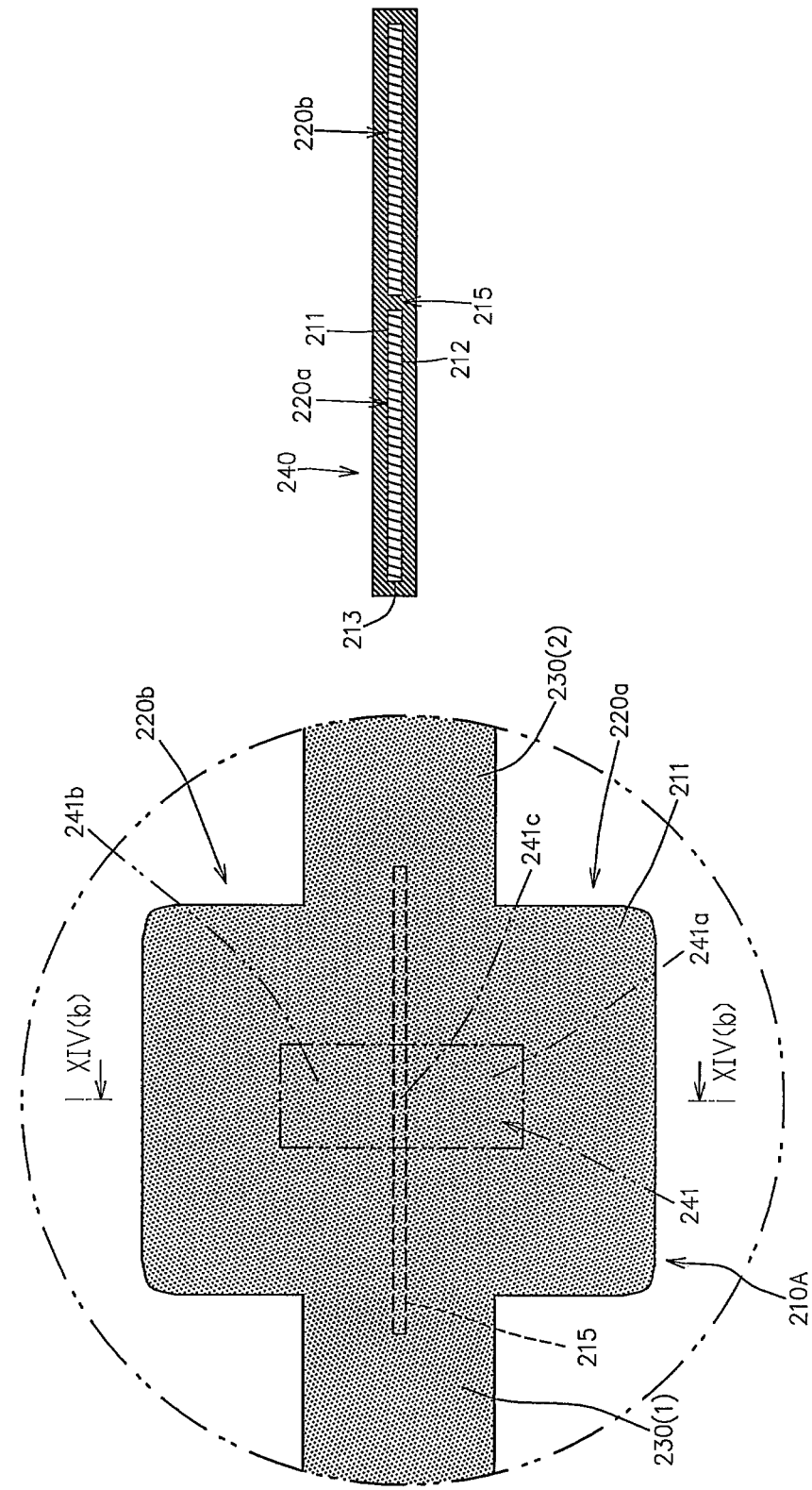

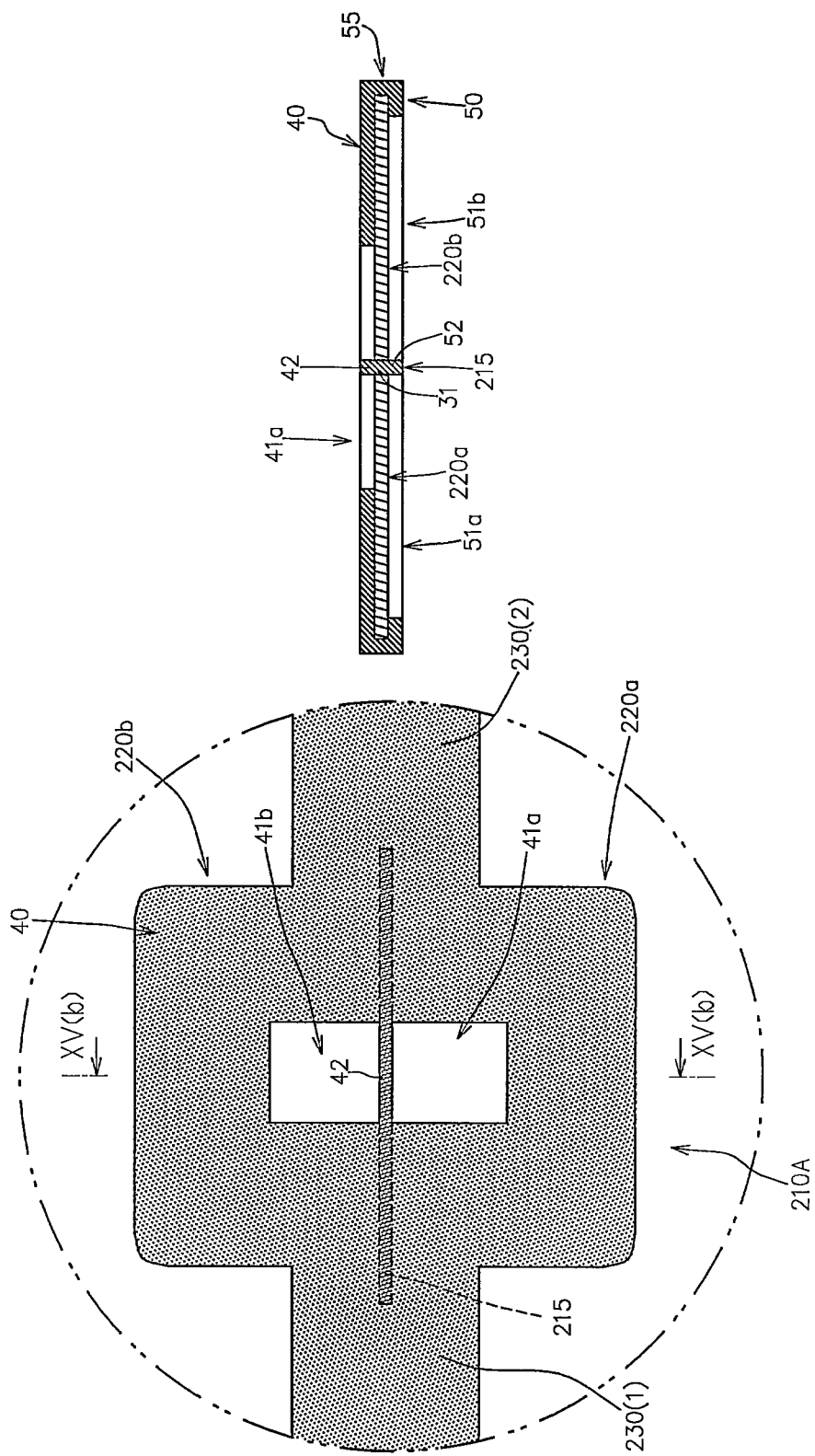

Prior Art

BUSBAR ASSEMBLY AND METHOD FOR MANUFACTURING THE SAME

FIELD OF THE INVENTION

The present invention relates to a busbar assembly in which a plurality of busbars are electrically insulated and mechanically connected to one another, and a method for manufacturing the same.

BACKGROUND ART

Busbar assemblies in which a plurality of busbars are mutually electrically insulated and mechanically connected are proposed, and are used in various fields.

For example, there are proposed laminated-type busbar assemblies in which a first flat plate busbar and another second flat plate busbar in parallel with each other are vertically laminated (see Patent Literatures 1 and 2 below).

In the laminated-type busbar assembly, the entirety of the opposing flat surface of the first flat plate busbar and the entirety of the opposing flat surface of the second flat plate busbar are disposed to face each other with an insulating resin therebetween, it is difficult to ensure sufficient reliability in electric insulating property.

In particular, if the insulating resin between the first and second flat plate busbars is made thin in order to downsize the busbar assembly in the vertical direction, there is a risk that a leakage current flows between the first and second busbars.

In order to solve the problems of the above laminated-type busbar assembly, the present applicant has filed applications for a planar-type busbar assembly in which first and second busbars of conductive metal flat plates are arranged in parallel in a common plane (see Patent Literatures 3 and 4 below).

FIG. 19A shows a plan view of an example of a planar-type busbar assembly 500.

FIG. 19B shows a cross-sectional view along the line XIX(b)-XIX(b) in FIG. 19A.

As shown in FIGS. 19A and 19B, the planar-type busbar assembly 500 has a first busbar 510a formed of a conductive metal flat plate, a second busbar 510b formed f a conductive metal flat plate and arranged in the same plane as the first busbar 510a with a gap 515 between the first busbar 510a and the second busbar 510b, and an insulative resin layer 520 that mechanically connects the first and second busbars 510a, 510b while electrically insulating them.

The insulative resin layer 520 has a gap filling part 525 filled in the gap 515, and a surface laminate part laminated on a surface of a busbar connection body where the first and second busbars 510a, 510b are connected by the gap filling part 525.

The surface laminate part includes a first surface-side laminate part 530 and a second surface-side laminate part 540 that cover a first surface on one side in the thickness direction and a second surface on the other side in the thickness direction of the busbar connection body, respectively, and a side surface-side laminate part 550 that covers an outside surface of the busbar connection body and connects the first and second surface-side laminate parts 530, 540.

The first surface-side laminate part 530 has first and second openings 531a, 531b that expose predetermined parts of the first surfaces of the first and second busbars 510a, 510b, respectively, thereby to form first and second exposure regions.

FIG. 19C shows a vertical cross-sectional view of a semiconductor module 600 in which a semiconductor element 110 such as an LED is mounted on the busbar assembly 500.

As shown in FIG. 19C, the semiconductor element 110 has a first electrode layer (lower electrode layer) mechanically and electrically connected to one of the first and second exposure regions (in FIG. 19C, the first exposure region) via, for example, a plating layer (not shown), and a second electrode layer (upper electrode layer) electrically connected to the other of the first and second exposure regions (the second exposure region in FIG. 19C) via a wire bonding 120.

FIGS. 20A to 20D show a process flow chart of an example of a manufacturing method of the above planar-type busbar assembly 500.

The manufacturing method includes a processes of arranging the first and second busbars 510a, 510b in the common plane with the gap 515 (FIG. 20A), applying an insulative resin member in the gap 515 and on the surfaces of the first and second busbars 510a, 510b, and curing the insulative resin member thereby to form the insulative resin layer 520 (FIG. 20B), and providing the first and second openings 531a and 531b by performing laser beam machining to the first surface-side laminate part 530 of the insulative resin layer 520 (FIGS. 20C and D).

FIG. 20E shows an enlarged view of the part XX(e) in FIG. 20D.

Here, in order to reduce the size of the semiconductor module 600 including the semiconductor element 110 with respect to the plate surface direction (planar direction), it is necessary to make the edges of the first and second openings 531a and 531b on the side proximate to the gap 515 as close as possible to or match the boundaries of the corresponding busbars 510a and 510b and the gap 515.

In order to do so, it is necessary to perform laser beam machining so that, when forming the first and second openings 531a, 531b, the edge of the first opening 531a on the side proximate to the gap 515 should be as close as possible to the end part (inner end part) of the first busbar 510a on the side proximate to the gap 515, and the edge of the second opening 531b on the side proximate to the gap 515 should be as close as possible to the end part (inner end part) of the second busbar 510b on the side proximate to the gap 515 (see FIGS. 21A and 21B).

FIG. 21C shows an enlarged view of the part XXI(c) in FIG. 21B.

However, when the laser beam machining is performed in this manner, as shown in FIG. 21C, a part of the gap filling part 525 is melted by the laser beam, and a pinhole 527 may be generated in the gap filling part 525.

The pinhole 527 leads to deterioration of the insulation performance and the connection strength between the first and second busbars 510a, 510b.

PRIOR ART DOCUMENT

Patent Literature

Patent Literature 1: Japanese Patent No. 4432913
Patent Literature 2: Japanese Patent No. 6487769
Patent Literature 3: Japanese Patent Publication No. 2019-042678
Patent Literature 4: Japanese Patent Publication No. 2019-050090

SUMMARY OF THE INVENTION

The present invention has been made in view of the conventional art, and it is an object of the present invention to provide a busbar assembly including a plurality of busbars arranged in the common plane with a gap present between adjacent busbars, and an insulative resin layer including a gap filling part filled in the gap and a first surface-side laminate part provided on a first surface on one side in a thickness direction of a busbar connection body where the plurality of busbars are connected by the gap filling part, the first surface-side laminate part having a plurality of first surface-side center openings that respectively expose a predetermined part of the first surface of the plurality of busbars, wherein the busbar assembly can cause an edge of the first surface-side center opening on a side proximate to the gap to be arranged as close as possible to or match a boundary between the corresponding busbar and the corresponding gap.

It is also an object of the present invention to provide a manufacturing method that can efficiently manufacture the above busbar assembly.

In order to achieve the object, a first aspect of the present invention provides a busbar assembly including a plurality of busbars each formed by a conductive flat plate member and disposed in a common plane with a gap provided between adjacent busbars, and an insulative resin layer including a gap filling part filled into the gap and a first surface-side laminate part provided on a first surface on one side in a plate thickness direction of a busbar connection body in which the plurality of busbars are connected to one another by the gap filling part, wherein the first surface-side laminate part has a plurality of first surface-side center openings that expose predetermined parts of the first surfaces of the plurality of busbars, respectively, to form a plurality of exposure regions, and wherein the insulative resin layer being formed by an insulative resin material that is transparent in a half-cured state and nontransparent in a completely cured state.

The busbar assembly according to the first aspect of the present invention includes the plurality of busbars disposed in the common plane with the gap provided between the adjacent busbars, and the insulative resin layer including the gap filling part filled into the gap and the first surface-side laminate part provided on the first surface on one side in the plate thickness direction of the busbar connection body in which the plurality of busbars are connected to one another by the gap filling part, wherein the first surface-side laminate part is formed with the plurality of first surface-side center openings that expose predetermined parts of the first surfaces of the plurality of busbars, respectively, to form the plurality of exposure regions, and wherein the insulative resin layer is formed by the insulative resin material that is transparent in a half-cured state and nontransparent in a completely cured state.

According to the busbar assembly, it is possible to make the edge of the first surface-side center opening on the side proximate to the gap substantially coincident with or as close as possible to the boundary of the corresponding busbar and the corresponding gap while effectively preventing or reducing generation of pinholes in the gap filling part by irradiating a laser beam to a laser area including first surface-side center opening formation areas that correspond to the plurality of first surface-side center openings and that are adjacent to each other with the gap being therebetween and an intermediate area sandwiched between the adjacent first surface-side center opening formation areas in a state that the insulative resin material provided on the entirety of the first surface of the busbar connection body is half-cured. Accordingly, it is possible to have a semiconductor element, which is mounted on the busbar assembly, arranged as close as possible to the gap while maintaining insulation property and connection strength between the adjacent busbars.

In a preferable embodiment, each of edges of the plurality of first surface-side center openings on a side proximate to the corresponding gap is aligned with a boundary between the corresponding busbar and the corresponding gap.

In a preferable embodiment, the first surface-side laminate part may be configured to have a partition wall part extending from the gap filling part outward toward one side in the thickness direction of the busbar connection body at an area sandwiched by the first surface-side center openings that are adjacent to each other with the gap being sandwiched therebetween.

Further, a second aspect of the present invention provides a busbar assembly including a plurality of busbars each formed by a conductive flat plate member and disposed in a common plane with a gap provided between adjacent busbars, and an insulative resin layer including a gap filling part filled into the gap and a first surface-side laminate part provided on a first surface on one side in a plate thickness direction of a busbar connection body in which the plurality of busbars are connected to one another by the gap filling part, wherein the first surface-side laminate part has a plurality of first surface-side center openings that expose predetermined parts of the first surfaces of the plurality of busbars, respectively, to form a plurality of exposure regions, and wherein the first surface-side laminate part has a partition wall part extending from the gap filling part outward toward one side in the thickness direction of the busbar connection body at an area sandwiched by the first surface-side center openings that are adjacent to each other with the gap being sandwiched therebetween.

The busbar assembly according to the second aspect of the present invention includes the plurality of busbars disposed in the common plane with the gap provided between the adjacent busbars, and the insulative resin layer including the gap filling part filled into the gap and the first surface-side laminate part provided on the first surface on one side in the plate thickness direction of the busbar connection body in which the plurality of busbars are connected to one another by the gap filling part, wherein the first surface-side laminate part is formed with the plurality of first surface-side center openings that expose predetermined parts of the first surfaces of the plurality of busbars, respectively, to form the plurality of exposure regions, and wherein the first surface-side laminate part has a partition wall part extending from the gap filling part outward toward one side in the thickness direction of the busbar connection body at an area sandwiched by the first surface-side center openings that are adjacent to each other with the gap being sandwiched therebetween.

According to the busbar assembly, it is possible to use the partition wall part as a stopper when mounting the semiconductor element directly or indirectly via a plating layer on the region exposed through the first surface-side center opening.

Accordingly, it is possible to have the semiconductor element arranged as close as possible to the gap while effectively preventing the semiconductor, which is mounted on one of the adjacent busbars, from unintentionally coming into contact with the other of the adjacent busbars.

Further, a third aspect of the present invention provides a busbar assembly including a plurality of busbars each formed by a conductive flat plate member and disposed in a common plane with a gap provided between adjacent busbars, and an insulative resin layer including a gap filling part filled into the gap and a first surface-side laminate part provided on a first surface on one side in a plate thickness direction of a busbar connection body in which the plurality of busbars are connected to one another by the gap filling part, wherein the first surface-side laminate part has a plurality of first surface-side center openings that expose predetermined parts of the first surfaces of the plurality of busbars, respectively, to form a plurality of exposure regions, and wherein the insulative resin layer is formed by an insulative resin material that is nontransparent in a completely cured state.

The busbar assembly according to the third aspect of the present invention includes the plurality of busbars disposed in the common plane with the gap provided between the adjacent busbars, and the insulative resin layer including the gap filling part filled into the gap and the first surface-side laminate part provided on the first surface on one side in the plate thickness direction of the busbar connection body in which the plurality of busbars are connected to one another by the gap filling part, wherein the first surface-side laminate part is formed with the plurality of first surface-side center openings that expose predetermined parts of the first surfaces of the plurality of busbars, respectively, to form the plurality of exposure regions, and wherein the insulative resin layer is formed by an insulative resin material that is nontransparent in a completely cured state.

According to the busbar assembly, it is possible to make the edge of the first surface-side center opening on the side proximate to the gap substantially coincident with or as close as possible to the boundary of the corresponding busbar and the corresponding gap while effectively preventing or reducing generation of pinholes in the gap filling part by irradiating a laser beam to a laser area including first surface-side center opening formation areas that correspond to the plurality of first surface-side center openings and that are adjacent to each other with the gap being therebetween and an intermediate area sandwiched between the adjacent first surface-side center opening formation areas in a state that the insulative resin material provided on the entirety of the first surface of the busbar connection body is fully cured. Accordingly, it is possible to have a semiconductor element, which is mounted on the busbar assembly, arranged as close as possible to the gap while maintaining insulation property and connection strength between the adjacent busbars.

In any one of the busbar assemblies according to the first to third aspects, the first surface-side laminate part is configured to have a center covering area that covers the first surface of the busbar connection body at an area surrounding the plurality of first surface-side center openings in plan view, a periphery opening that exposes the first surface of the busbar connection body at an area surrounding the center covering area, and a periphery covering area that covers the first surface of the busbar connection body at an area surrounding the periphery opening in plan view.

Alternatively, any one of the busbar assemblies according to the first to third aspects may further include a frame that includes a cylindrical frame body with a center hole and an insulative resin layer covering an outer peripheral surface of the frame body.

The frame is fixed to a peripheral area of the first surface of the busbar connection body so as to surround the plurality of first surface-side center openings in plan view.

In any one of the above various configurations, the insulative resin layer is configured to have a second surface-side laminate part provided on a second surface on the other side in the plate thickness direction of the busbar connection body, and a side surface-side laminate part provided on a side surface of the busbar connection body and connecting the first and second surface-side laminate parts, wherein the second surface-side laminate part has a plurality of second surface-side center openings that expose predetermined parts of the second surfaces of the plurality of busbars, respectively, to form a plurality of exposure regions.

In a preferable embodiment, each of edges of the plurality of second surface-side center openings on a side proximate to the corresponding gap is aligned with a boundary between the corresponding busbar and the corresponding gap.

In a preferable embodiment, the second surface-side laminate part may further include a partition wall part extending from the gap filling part outward toward the other side in the thickness direction of the busbar connection body at an area sandwiched by the second surface-side center openings that are adjacent to each other with the gap being sandwiched therebetween.

Further, the present invention provides a first manufacturing method of a busbar assembly including a plurality of busbars each formed by a conductive flat plate member and disposed in a common plane with a gap provided between adjacent busbars, and an insulative resin layer including a gap filling part filled into the gap and a first surface-side laminate part provided on a first surface on one side in a plate thickness direction of a busbar connection body in which the plurality of busbars are connected to one another by the gap filling part, wherein the first surface-side laminate part has a plurality of first surface-side center openings that expose predetermined parts of the first surfaces of the plurality of busbars, respectively, to form a plurality of exposure regions, the first manufacturing method including a process of preparing a conductive metal flat plate having a busbar assembly formation area that forms the plurality of busbars, a slit formation process of forming, in the busbar assembly formation area, one or plural slit penetrating between a first surface on one side and a second surface on the other side in the thickness direction and having a width same as the gap so as to define a plurality of busbar formation parts corresponding to the plurality of busbars, a process of providing an insulative resin material in the slit and on an entirety of the first surface of the busbar assembly formation area, wherein the insulative resin material is transparent in a half-cured state and nontransparent in a completely cured state, a half-curing process of half-curing the insulative resin material, a laser beam irradiation process of irradiating a laser beam to the half-cured insulative resin material at a center laser area to form first surface-side first and second center openings, wherein the center laser area includes a first center opening formation area corresponding to the first surface-side first center opening that exposes the predetermined part of the first surface of a first busbar that is one of the busbars adjacent to each other with the gap being sandwiched therebetween, a second center opening formation area corresponding to the first surface-side second center opening that exposes the predetermined part of the first surface of a second busbar that is the other one of the busbars adjacent to each other with the gap being sandwiched therebetween, and an intermediate area sandwiched between the first and second center opening formation areas, a complete curing process of completely curing the half-cured insulative resin material, and a cutting process of cutting the busbar assembly formation area from the conductive metal flat plate.

Among the first manufacturing method, in a case where the first surface-side laminate part has a center covering area that covers the first surface of the busbar connection body at an area surrounding the plurality of first surface-side center openings in plan view, a periphery opening that exposes the first surface of the busbar connection body at an area surrounding the center covering area, and a periphery covering area that covers the first surface of the busbar connection body at an area surrounding the periphery opening in plan view, the laser beam irradiation process is configured to irradiate the laser beam to a periphery opening formation area that corresponds to the periphery opening to form the periphery opening, in addition to the center laser area.

In the first manufacturing method, the conductive metal flat plate is preferably configured to integrally have a plurality of the busbar assembly formation areas arranged in series in a first direction along a longitudinal direction of the slit, and a connection area connecting between adjacent busbar assembly formation areas.

In this case, the slit formed in one busbar assembly formation area is formed to have one side in the longitudinal direction extending into one connection area connected to the one side in the first direction of the one busbar assembly formation area, and another side in the longitudinal direction extending into another connection area connected to another side in the first direction of the one busbar assembly formation area.

Further, the present invention provides a second manufacturing method of a busbar assembly including a plurality of busbars each formed by a conductive flat plate member and disposed in a common plane with a gap provided between adjacent busbars, an insulative resin layer including a gap filling part filled into the gap and a first surface-side laminate part provided on a first surface on one side in a plate thickness direction of a busbar connection body in which the plurality of busbars are connected to one another by the gap filling part, and a frame fixed to a peripheral area of the first surface of the busbar connection body, wherein the first surface-side laminate part has a plurality of first surface-side center openings that expose predetermined parts of the first surfaces of the plurality of busbars, respectively, to form a plurality of exposure regions, wherein the frame has a cylindrical frame body having a center hole and an insulative resin layer covering an outer peripheral surface of the frame body, and is fixed to the peripheral area of the first surface of the busbar connection body so as to surround the plurality of first surface-side center openings in plan view, the second manufacturing method including a process of preparing a busbar-directed conductive metal flat plate having a busbar assembly formation area that forms the plurality of busbars; a slit formation process of forming, in the busbar assembly formation area, one or plural slit penetrating between a first surface on one side and a second surface on the other side in the thickness direction and having a width same as the gap so as to define a plurality of busbar formation parts corresponding to the plurality of busbars; a process of providing an insulative resin material in the slit and on an entirety of the first surface of the busbar assembly formation area, wherein the insulative resin material is transparent in a half-cured state and nontransparent in a completely cured state; a half-curing process of half-curing the insulative resin material; a laser beam irradiation process of irradiating a laser beam to the half-cured insulative resin material at a center laser area to form first surface-side first and second center openings, wherein the center laser area includes a first center opening formation area corresponding to the first surface-side first center opening that exposes the predetermined part of the first surface of a first busbar that is one of the busbars adjacent to each other with the gap being sandwiched therebetween, a second center opening formation area corresponding to the first surface-side second center opening that exposes the predetermined part of the first surface of a second busbar that is the other one of the busbars adjacent to each other with the gap being sandwiched therebetween, and an intermediate area sandwiched between the first and second center opening formation areas; a frame formation operation that is performed in parallel with or before or after an operation from the process of preparing the busbar-directed conductive metal flat plate until the laser beam irradiation process, wherein the frame formation operation includes a process of preparing a frame-directed conductive metal flat plate having a frame formation area that has the thickness same as that of the frame body and that has an outer peripheral shape corresponding to the busbar assembly formation area in plan view, a process of punching out a center of the frame formation area to form a frame body formation part corresponding to the frame body, and a process of providing an insulative resin material on an outer peripheral surface of the frame body formation part; an assembling process of overlapping the busbar-directed conductive metal flat plate and the frame-directed conductive metal flat plate with each other in the state in which at least one of the insulative resin material remained on the busbar-directed conductive metal flat plate after the laser beam irradiation process and the insulative resin material provided on the frame-directed conductive metal flat plate is half-cured, and then completely curing the insulative resin material in the half-cured state to have the metal flat plates fixed to each other; and a cutting process of cutting the busbar assembly formation area and the frame formation area that are overlapped with each other from the busbar-directed conductive metal flat plate and the frame-directed conductive metal flat plate after the assembling process.

Further, the present invention provides a third manufacturing method of a busbar assembly including a plurality of busbars each formed by a conductive flat plate member and disposed in a common plane with a gap provided between adjacent busbars, a busbar-side insulative resin layer including a gap filling part filled into the gap and a first surface-side laminate part provided on a first surface on one side in a plate thickness direction of a busbar connection body in which the plurality of busbars are connected to one another by the gap filling part, and a frame fixed to a peripheral area of the first surface of the busbar connection body, wherein the first surface-side laminate part has a plurality of first surface-side center openings that expose predetermined parts of the first surfaces of the plurality of busbars, respectively, to form a plurality of exposure regions, wherein the frame has a cylindrical frame body having a center hole and a frame-side insulative resin layer covering an outer peripheral surface of the frame body, and is fixed to the peripheral area of the first surface of the busbar connection body so as to surround the plurality of first surface-side center openings in plan view, the third manufacturing method including a process of preparing a busbar-directed conductive metal flat plate having a busbar assembly formation area that forms the plurality of busbars; a slit formation process of forming, in the busbar assembly formation area, one or plural slit penetrating between a first surface on one side and a second surface on the other side in the thickness direction and having a width same as the gap so as to define a plurality of busbar formation parts corresponding to the plurality of busbars; a process of providing an insulative resin material in the slit and on an entirety of the first surface of the busbar assembly formation area, wherein the insulative resin material is transparent in a half-cured state and nontransparent in a completely cured state; a half-curing process of half-curing the insulative resin material; a laser beam irradiation process of irradiating a laser beam to the half-cured insulative resin material at a center laser area to form first surface-side first and second center openings, wherein the center laser area includes a first center opening formation area corresponding to the first surface-side first center opening that exposes the predetermined part of the first surface of a first busbar that is one of the busbars adjacent to each other with the gap being sandwiched therebetween, a second center opening formation area corresponding to the first surface-side second center opening that exposes the predetermined part of the first surface of a second busbar that is the other one of the busbars adjacent to each other with the gap being sandwiched therebetween, and an intermediate area sandwiched between the first and second center opening formation areas; a process of completely curing the insulative resin material remained on the busbar-directed conductive metal flat plate after the laser beam irradiation process to form the busbar-side insulative resin layer; a frame formation operation that is performed in parallel with or before or after an operation from the process of preparing the busbar-directed conductive metal flat plate until the process of completely curing the insulative resin material remained on the busbar-directed conductive metal flat plate, wherein the frame formation operation includes a process of preparing a frame-directed conductive metal flat plate having a frame formation area that has the thickness same as that of the frame body and that has an outer peripheral shape corresponding to the busbar assembly formation area in plan view, a process of punching out a center of the frame formation area to form a frame body formation part corresponding to the frame body, a process of providing an insulative resin material on an outer peripheral surface of the frame body formation part, and a process of completely curing the insulative resin material provided on the frame body formation part to form the frame-side insulative resin layer; an assembling process of having the busbar-directed conductive metal flat plate and the frame-directed conductive metal flat plate fixed to each other via an adhesive so that both the conductive metal flat plates are overlapped with each other; and a cutting process of cutting the busbar assembly formation area and the frame formation area that are overlapped with each other from the busbar-directed conductive metal flat plate and the frame-directed conductive metal flat plate after the assembling process.

In the second and third manufacturing methods, the busbar-directed conductive metal flat plate is preferably configured to integrally have a plurality of the busbar assembly formation areas arranged in series in a first direction along a longitudinal direction of the slit, and a connection area connecting between adjacent busbar assembly formation areas, and the frame-directed conductive metal flat plate is preferably configured to integrally have a plurality of the frame formation areas arranged so as to correspond to the plurality of busbar assembly formation areas of the busbar-directed conductive metal flat plate and a connection area connecting between adjacent frame formation areas.

In the preferable configuration, the slit formed in one busbar assembly formation area is configured to have one side in the longitudinal direction extending into one connection area connected to the one side in the first direction of the one busbar assembly formation area, and another side in the longitudinal direction extending into another connection area connected to another side in the first direction of the one busbar assembly formation area.

BRIEF DESCRIPTION OF THE DRAWINGS

FIG. 5 is a plan view of a busbar connection body including first and second busbars that is arranged in parallel in a common plane with a gap therebetween and that are mechanically connected to each other by an insulative resin material filled into the gap, FIG. 5 showing a state where an entirety of a first surface of the busbar connection body on one side in a thickness direction is provided with an insulative resin material.

FIG. 10 is a bottom view of the part IX(a) in FIG. 8.

FIG. 12 is a plan view of a busbar assembly according to a second embodiment of the present invention.

FIG. 14A is an enlarged plan view of a busbar assembly formation area in a busbar-directed conductive metal flat plate used in a method (second manufacturing method) for manufacturing the busbar assembly according to the second embodiment, FIG. 14A showing a state after a half-curing process in the first manufacturing method. FIG. 14B is a cross-sectional view along the line XIV(b)-XIV(b) in FIG. 14A.

FIG. 15A is a plan view of the busbar assembly formation area shown in FIG. 14A, FIG. 15A showing a state after a laser beam irradiation process in the second manufacturing method. FIG. 15B is a cross-sectional view along the line XV(b)-XV(b) in FIG. 15A.

EMBODIMENT FOR CARRYING OUT THE INVENTION

First Embodiment

One embodiment of a busbar assembly according to the present invention will be described below with reference to the accompanying drawings.

Figure 1:
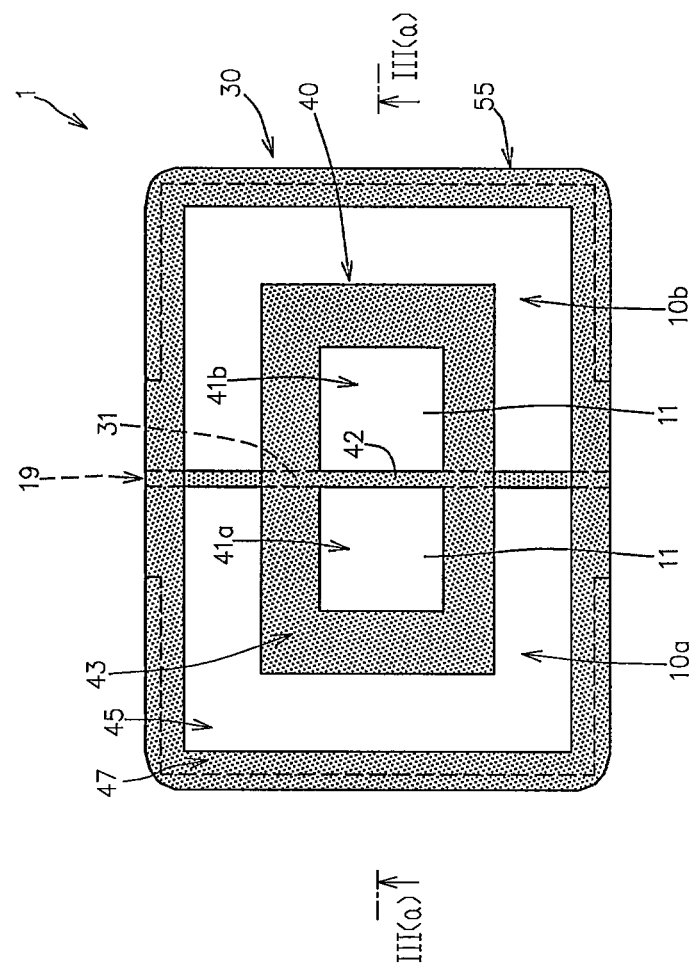
FIG. 1 is a plan view of a busbar assembly according to a first embodiment of the present invention.
Figure 2:
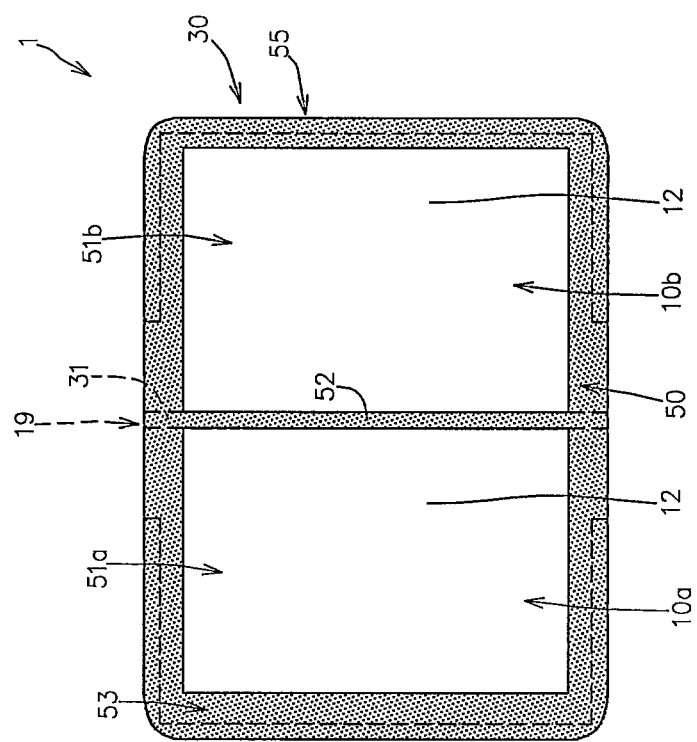
FIG. 2 is a bottom view of the busbar assembly according to the first embodiment.

FIGS. 1 and 2 show a plan view and a bottom view, respectively, of a busbar assembly 1 according to the present embodiment.

Figure 3A:
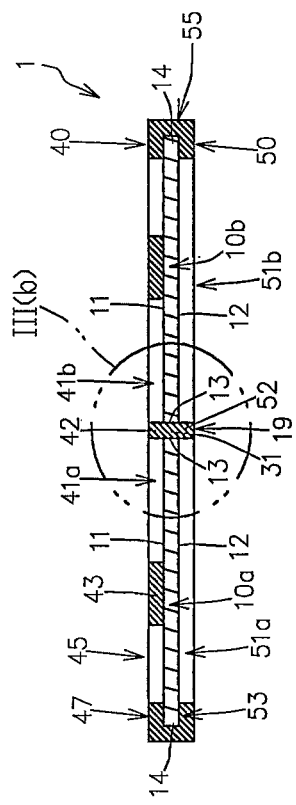
FIG. 3A is a cross-sectional view along the line III(a)-III(a) in FIG. 1.

FIG. 3A shows a cross-sectional view along the line III(a)-III(a) in FIG. 1.

Figure 3B:
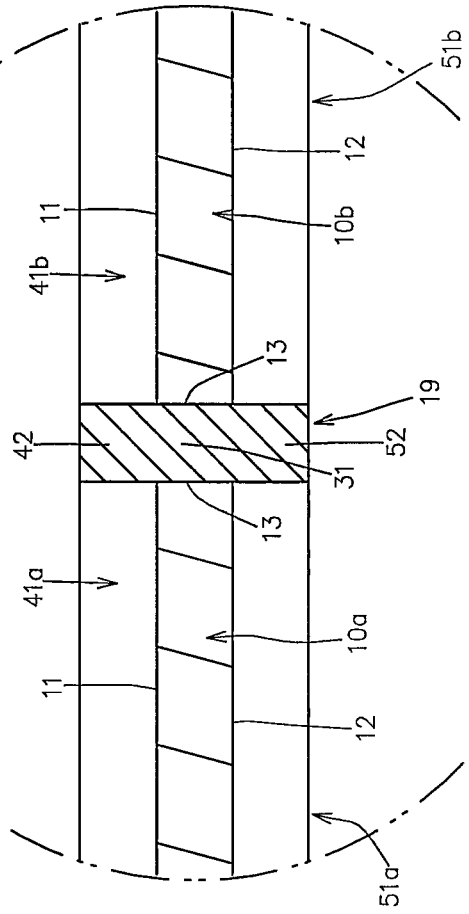
FIG. 3B shows an enlarged view of part III(b) in FIG. 3A.

Further, FIG. 3B shows an enlarged view of part III(b) in FIG. 3A.

As shown in FIGS. 1 to 3, the busbar assembly 1 has a plurality of busbars 10 formed by a conductive flat plate member and arranged in the common plane with gaps 19 between side surfaces of adjacent busbars, and an insulative resin layer 30 fixed to the plurality of busbars 10.

The busbar assembly 1 according to the present embodiment has two busbars including first and second busbars 10a and 10b, as the plurality of busbars 10.

As shown in FIGS. 3A and 3B, the first and second busbars 10a, 10b have, in a vertical sectional view along the thickness direction, a first surface 11 on one side in the thickness direction, a second surface 12 on the other side in the thickness direction, opposing side surfaces 13 facing each other, and outside surfaces 14 facing directions away from each other.

The first and second busbars 10a, 10b are formed of conductive metal such as Cu.

Figures 4A, 4B:
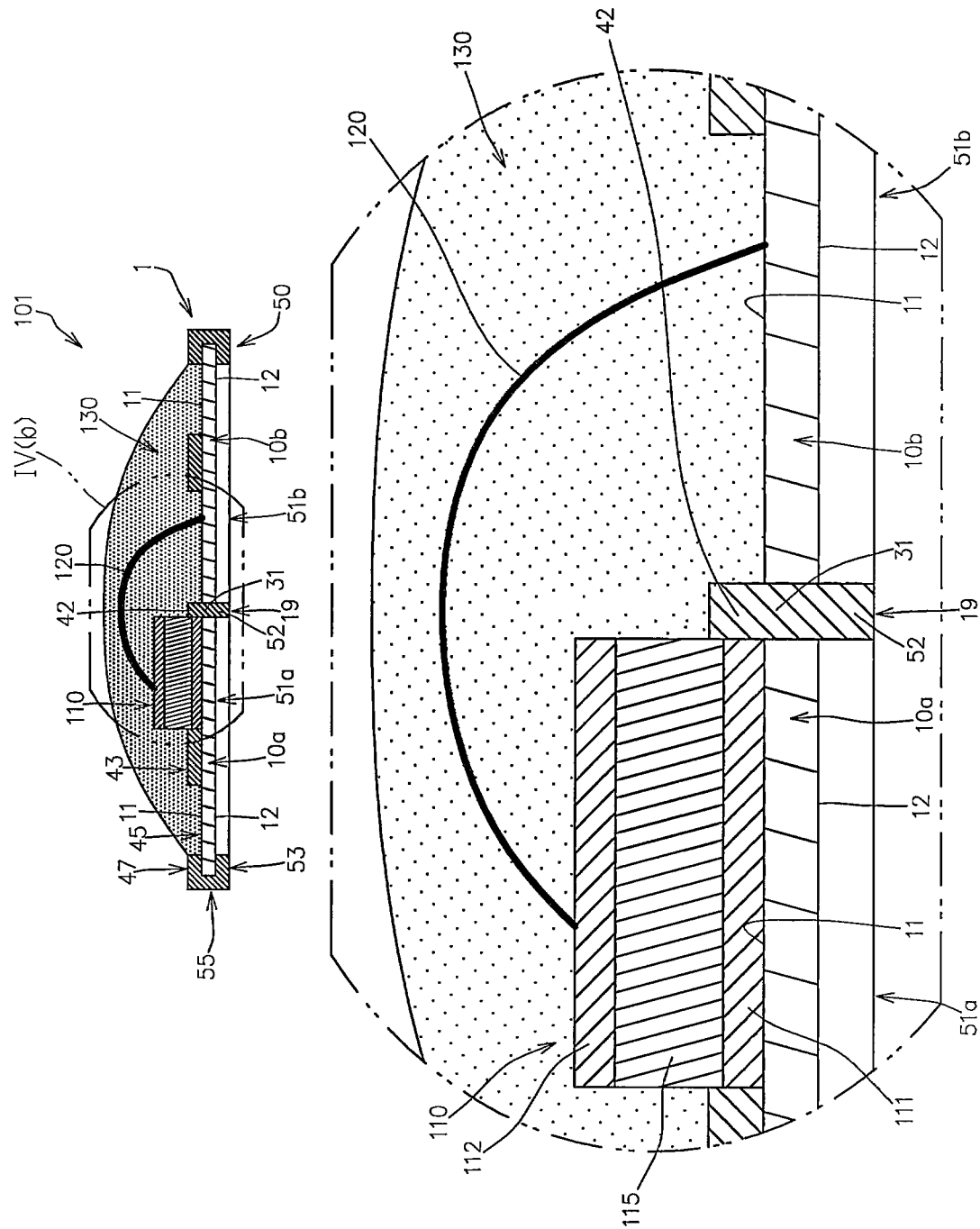
FIG. 4A is a vertical cross-sectional view of a semiconductor module in which a semiconductor element such as an LED is mounted on the busbar assembly according to the first embodiment.
FIG. 4B is an enlarged view of part IV(b) in FIG. 4A.

FIG. 4A shows a vertical cross-sectional view of an example of a semiconductor module 101 in which a semiconductor element 110 such as an LED is mounted on the busbar assembly 1, and FIG. 4B shows an enlarged view of part IV(b) in FIG. 4A.

In the semiconductor module 101, one of the first and second busbars 10a, 10b acts as a positive side electrode and the other as a negative side electrode.

That is, the semiconductor element 110 has first and second electrode layers 111 and 112 on a lower surface on one side in the thickness direction and on an upper surface on the other side in the thickness direction, respectively, and has an element body 115 between the first and second electrode layers 111 and 112.

The semiconductor element 110 has the first electrode layer 111 firmly attached in an electrically connected state to the first surface 11 of the one busbar (e.g., the first busbar 10a), and the second electrode layer 112 electrically connected to the first surface 11 of the other busbar (e.g., the second busbar 10b) via an electrical connection member 120 such as wire bonding.

In detail, the semiconductor element 110 is die-bonded so that the first electrode layer 111 is electrically connected to a plating layer (not shown) provided on the first surface 11 of the one busbar, and the second electrode layer 112 is electrically connected, via the wire bonding 120, to a plating layer (not shown) provided on the first surface 11 of the other busbar.

A reference numeral 130 in FIGS. 4A and 4B denotes a sealing resin layer firmly attached to the first surface of the busbar assembly 1 so as to protect parts such as the semiconductor element 110 and the electrical connection member 120 which are mounted on the busbar assembly 1.

The sealing resin layer 130 is, for example, a transparent resin such as polyimide, polyamide, epoxy, or the like.

In the present embodiment, the insulative resin layer 30 is formed by an insulative resin material which is a resin having heat resistance and insulative properties, and which is transparent in a half-cured state and nontransparent in a completely cured state.

As the insulative resin material, for example, Insuleed (registered trademark) is preferably utilized.

The above "transparent" means being transmissive to a laser beam (e.g., wavelength of 1064 nm) described below, and the above "nontransparent" means being absorbent to the laser beam so as to be heated and melted by irradiation of the laser beam.

As shown in FIGS. 1 to 3, the insulative resin layer 30 has a gap filling part 31 which fills the gap 19 between opposing side surfaces 13 of the first and second busbars 10a, 10b and which mechanically connects the first and second busbars 10a, 10b in an electrically insulated state, and a surface laminate part provided on an outer surface of a busbar connection body where the first and second busbars 10a, 10b are connected by the gap filling part 31.

According to the busbar assembly 1 having such a configuration, since the first and second busbars 10a, 10b are arranged in the common plane, the size can be reduced as much as possible with respect to the vertical direction (thickness direction).

In addition, since the first and second busbars 10a, 10b are arranged so as to face each other on the opposing side surfaces 13, the area where the first and second busbars 10a, 10b face each other can be made as small as possible compared with a laminated-type busbar assembly in which a plurality of busbars are laminated vertically; with this, a leakage current across the first and second busbars 10a and 10b can be effectively prevented or reduced.

In the present embodiment, the surface laminate part has a first surface-side laminate part 40 provided on the first surface on one side in the plate thickness direction of the busbar connection body, a second surface-side laminate part 50 provided on the second surface on the other side in the plate thickness direction of the busbar connection body, and a side surface-side laminate part 55 provided on the side surface of the busbar connection body and connecting the first and second surface-side laminate parts 40 and 50.

As shown in FIGS. 1 to 3, the first surface-side laminate part 40 has first surface-side first and second center openings 41a, 41b that expose predetermined parts of the first surfaces 11 of the first and second busbars 10a, 10b, respectively, at a center area of the busbar connection body in the plan view thereby to form first and second central exposure regions, and a center covering area 43 covering the first surface of the busbar connection body at an area surrounding the first surface-side first and second center openings 41a, 41b.

Here, in the present embodiment, as shown in FIGS. 1 and 3A, an edge of the first surface-side first center opening 41a on a side proximate to the gap 19 is made substantially coincident with a boundary between the first busbar 10a and the gap 19. That is, the edge of the first surface-side first center opening 41a on the side proximate to the gap 19 and an end part of the first busbar 10a (inner end part) on the side proximate to the gap 19 are substantially aligned with each other.

Similarly, the edge of the first surface-side second center opening 41b on the side proximate to the gap 19 is made substantially coincident with the boundary of the second busbar 10b and the gap 19. That is, the edge of the first surface-side second center opening 41b on the side proximate to the gap 19 and an end part (inner end part) of the second busbar 10b on the side proximate to the gap 19 are substantially aligned with each other.

FIG. 5 shows a plan view of the busbar connection body in a state where an insulative resin material 240 forming the insulative resin layer 30 is provided in the gap 19 and on the first surface on one side of the busbar connection body in the thickness direction.

In the case that the insulative resin material 240 is transparent in the half-cured state and nontransparent in the completely cured state, in the half-cured state of the insulative resin material 240, irradiating a laser beam to a first surface-side center laser area 241, which includes a first surface-side first center opening formation area 241a corresponding to the first surface-side first center opening 41a, a first surface-side second center opening formation area 241b corresponding to the first surface-side second center opening 41b, and a first surface-side intermediate area 241c sandwiched between the first surface-side first and second center opening formation areas 241a and 241b, can melt, out of the first surface-side center laser area 241, the parts in which the first and second busbars 10a, 10b are present immediately below (i.e., the first surface-side first and second center opening formation areas 241a and 241b), faster than the first surface-side intermediate area 241c.

Then, after the first surface-side first surface-side first and second center opening formation areas 241a and 241b are melted and removed, the insulative resin material 240 is completely cured, making it possible to form the insulative resin layer 30.

The thus configuration makes it possible to make the edge of the first surface-side first center opening 41a on the side proximate to the gap 19 substantially coincident with the boundary between the first busbar 10a and the gap 19, and also make the edge of the first surface-side second center opening 41b on the side proximate to the gap 19 substantially coincident with the boundary between the second busbar 10b and the gap 19 while effectively preventing or reducing generation of pinholes in the gap filling part 31.

Further, since it is substantially prevented or reduced to melt the gap filling part 31 where any busbar is not present directly below when the laser beam is irradiated to the first surface-side center laser area 241 in a state that the insulative resin material 240 is in the half-cured state, the first surface-side laminate part 40 is configured to have a first surface-side partition wall part 42 extending from the gap filling part 31 outward toward one side in the thickness direction of the busbar connection body at an area sandwiched by the first surface-side first and second center openings 41a, 41b in the present embodiment, as shown in FIG. 3B.

The first surface-side partition wall part 42 acts as a stopper that prevents misalignment of the semiconductor element 110 when mounting the semiconductor element 110, with an adhesive, on the first surface-side first and second central exposure regions exposed through the first surface-side first and second center openings 41a and 41b.

Accordingly, as shown in FIG. 4B, the semiconductor element 110 can be mounted on the corresponding exposure region (the first surface-side first central exposure region in the form shown), with the semiconductor element 110 as close as possible to the gap 19.

As shown in FIG. 1 and the like, in the present embodiment, the first surface-side laminate part 40 further has a periphery opening 45 that exposes the first surface of the busbar connection body in an area surrounding the center covering area 43, and a first surface-side periphery covering area 47 that covers the first surface of the busbar connection body in an area surrounding the periphery opening 45.

The periphery opening 45 forms a recess part (groove part) opening to the side of the first surface in cooperation with the center covering area 43 and the first surface-side periphery covering area 47, and a step between the periphery opening 45 and the first surface-side periphery covering area 47 forms a damming structure of the sealing resin layer 130.

That is, as described above, the sealing resin layer 130 (see FIGS. 4A and 4B) for protecting components such as the semiconductor element 110 and any necessary electrical connection member which are mounted on the busbar assembly 1 is provided by applying, onto the first surface of the busbar assembly 1, a resin forming the sealing resin layer 130 in a manner to enclose the above components and by curing the resin. At that time, it is necessary to provide the damming structure that prevents the resin from flowing out.

As shown in FIG. 4A, in the present embodiment, the recess part (groove part) formed by the center covering area 43, the periphery opening 45, and the first surface-side periphery covering area 47 forms the damming structure.

As shown in FIG. 2 and the like, the second surface-side laminate part 50 has a second surface-side center opening 51 that exposes the second surfaces 12 of the first and second busbars 10a and 10b at the center area in the bottom view, and a second surface-side periphery covering area 53 that covers the second surface of the busbar connection body at an area surrounding the second surface-side center opening 51.

In the present embodiment, the second surface-side center opening 51 has second surface-side first and second center openings 51a and 51b which expose the second surfaces of the first and second busbars 10a and 10b, respectively.

As shown in FIGS. 3B and 4B, the second surface-side laminate part 50 further has a second surface-side partition wall part 52 extending from the gap filling part 31 outward toward the other side in the thickness direction of the busbar connection body at an area sandwiched by the second surface-side first and second center openings 51a, 51b.

Also by irradiating a laser beam to the second surface side of the busbar connection body in the half-cured state of the insulative resin material 240, it is possible to make the edge of the second surface-side first center opening 51a on the side proximate to the gap 19 substantially coincident with the boundary between the first busbar 10a and the gap 19, and also make the edge of the second surface-side second center opening 51b on the side proximate to the gap 19 substantially coincident with the boundary between the second busbar 10b and the gap 19 while effectively preventing or reducing generation of pinholes in the gap filling part 31.

Next, a manufacturing method (hereinafter referred to as a first manufacturing method) of the busbar assembly 1 will be described.

Figure 6:
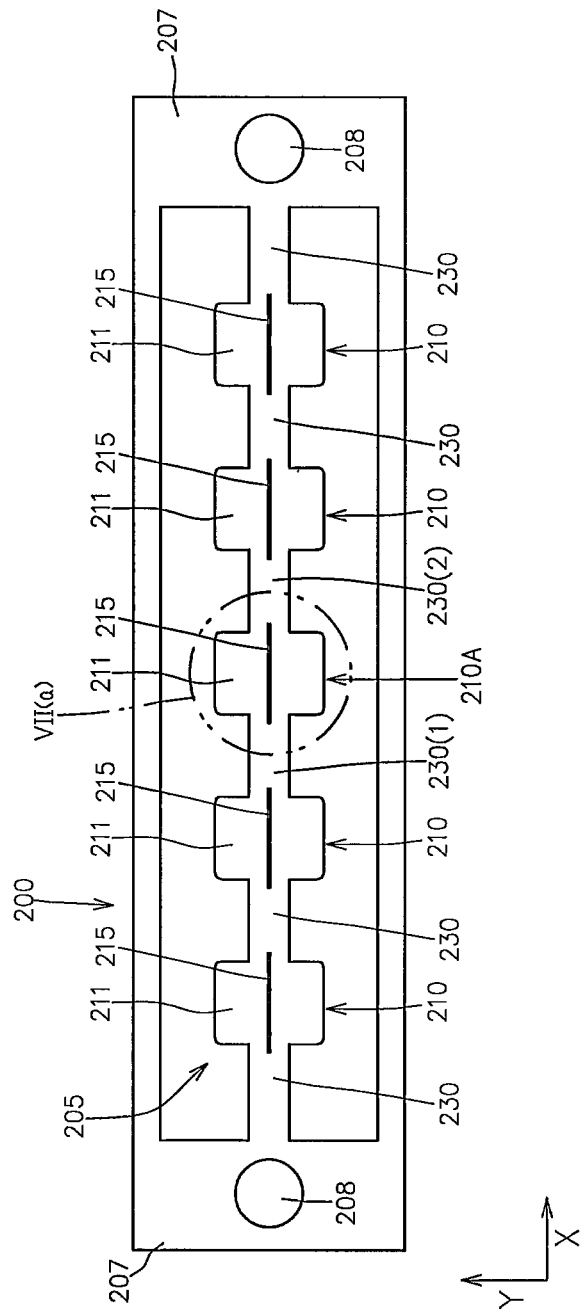
FIG. 6 is a plan view of a busbar-directed conductive metal flat plate used in a method (first manufacturing method) for manufacturing the busbar assembly according to the first embodiment, FIG. 6 showing a state after a slit formation process in the first manufacturing method.

FIG. 6 shows a plan view of a busbar-directed conductive metal flat plate 200 used in the above first manufacturing method.

Figures 7A, 7B:
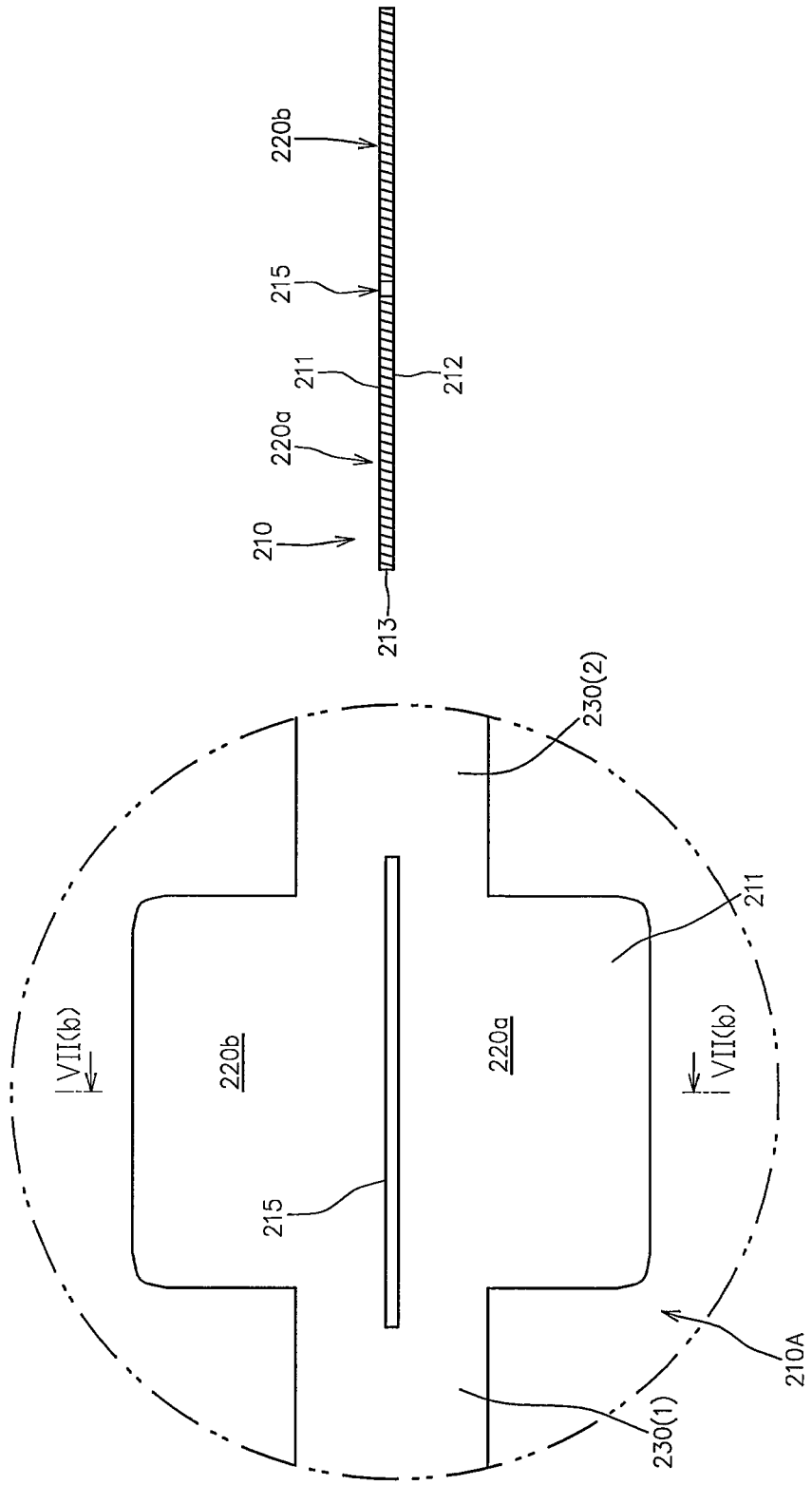
FIG. 7A is an enlarged view of the part VII(a) in FIG. 6.
FIG. 7B is a cross-sectional view along the line VII(b)-VII(b) in FIG. 7A.

Further, FIG. 7A shows an enlarged view of the part VII(a) in FIG. 6, and FIG. 7B shows a cross-sectional view along the line VII(b)-VII(b) in FIG. 7A.

As shown in FIGS. 6 and 7, the first manufacturing method includes a process of preparing the busbar-directed conductive metal flat plate 200 having a busbar assembly formation area 210A that is same in thickness as the first and second busbars 10a and 10b, and a slit formation process of forming, in the busbar assembly formation area 210A, slit 215 penetrating between a first surface 211 on one side in the thickness direction and a second surface 212 on the other side in the thickness direction.

FIG. 6 shows a state after the completion of the above slit formation process.

As described above, the busbar assembly 1 has two busbars, the first and second busbars 10a and 10b, as the plurality of busbars 10. Due to this, one slit 215 is formed in the above busbar assembly formation area 210.

For example, for manufacturing a busbar assembly including three busbars arranged in parallel, two slits are formed.

As shown in FIGS. 7A and 7B, in the present embodiment, the busbar-directed conductive metal flat plate 200 has a busbar row 205 including a plurality of the busbar assembly formation areas 210a arranged in series along an X direction in an X-Y plane in which the busbar-directed conductive metal flat plate 200 is located, and connection areas 230 connecting between busbar assembly formation areas 210 adjacent in the X direction, so that processing can be simultaneously performed on the plurality of busbar assembly formation areas 210.

In the present embodiment, the busbar-directed conductive metal flat plate 200 has a pair of grip pieces 207 connected to one side and the other side in the longitudinal direction (X direction) of the busbar row 205, respectively, and the pair of grip pieces 207 are provided with positioning holes 208.

It is also possible to have a plurality of the busbar rows 205 arranged in parallel in the Y direction and to grip the plurality of busbar rows 205, which are arranged in parallel in the Y direction integrally, by the pair of grip pieces 207, 207.

According to such a modified configuration, a larger number of busbar assemblies 1 can be simultaneously manufactured.

In the present embodiment, the length of the busbar assembly formation area 210 in the X direction is set to be the same as the busbar assembly 1's length in the direction parallel to the gap 19, and the length of the busbar assembly formation area 210 in the Y direction is set to be the same as the busbar assembly 1's length in the direction orthogonal to the gap 19.

The slit 215 forms the gap 19 in the busbar assembly 1, and has a width same as that of the gap 19.

Further, the width of the gap 19 is determined according to the specification of the busbar assembly 1.

In the present embodiment, the slit 215 formed in one busbar assembly formation area 210A has one side extending into one connection area 230(1) connected to the one side in the longitudinal direction (X-direction) of the one busbar assembly formation area 210A, and another side extending into another connection area 230(2) connected to another side in the longitudinal direction (X-direction) of the one busbar assembly formation area 210A.

Then, in the state after the slit formation process, first and second busbar formation parts 220a, 220b facing each other via the slit 215 formed in the one busbar assembly formation area 210A are so configured as to be maintained in a state of being connected to each other via the one connection area 230(1) and the other connection area 230(2).

Providing such a configuration can form the slit 215 (the gap 19) with high accuracy.

The first manufacturing method has a process of providing, after the slit formation process, the insulative resin material 240, which forms the insulative resin layer 30, in the slit 215 and on the first surface 211 on one side in the thickness direction of the busbar assembly formation area 210.

Figure 8:
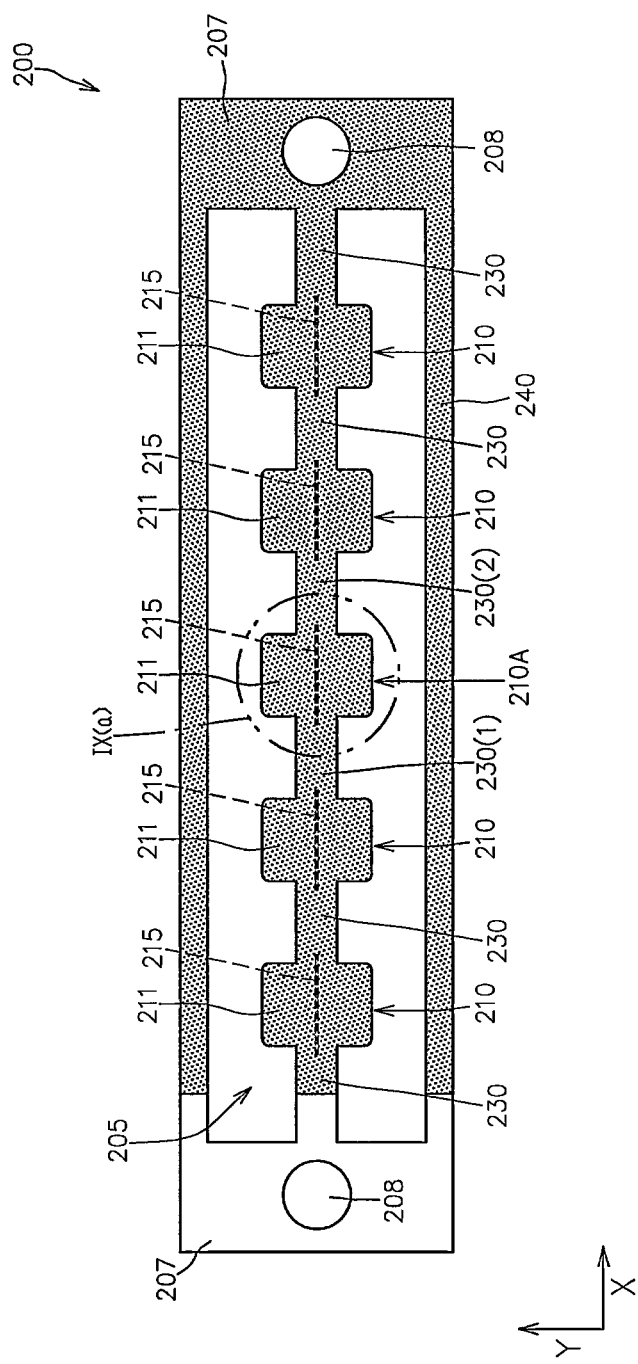
FIG. 8 is a plan view of the busbar-directed conductive metal flat plate provided with an insulative resin material.

FIG. 8 shows a plan view of the busbar-directed conductive metal flat plate 200 provided with the insulative resin material 240.

Figures 9A, 9B:
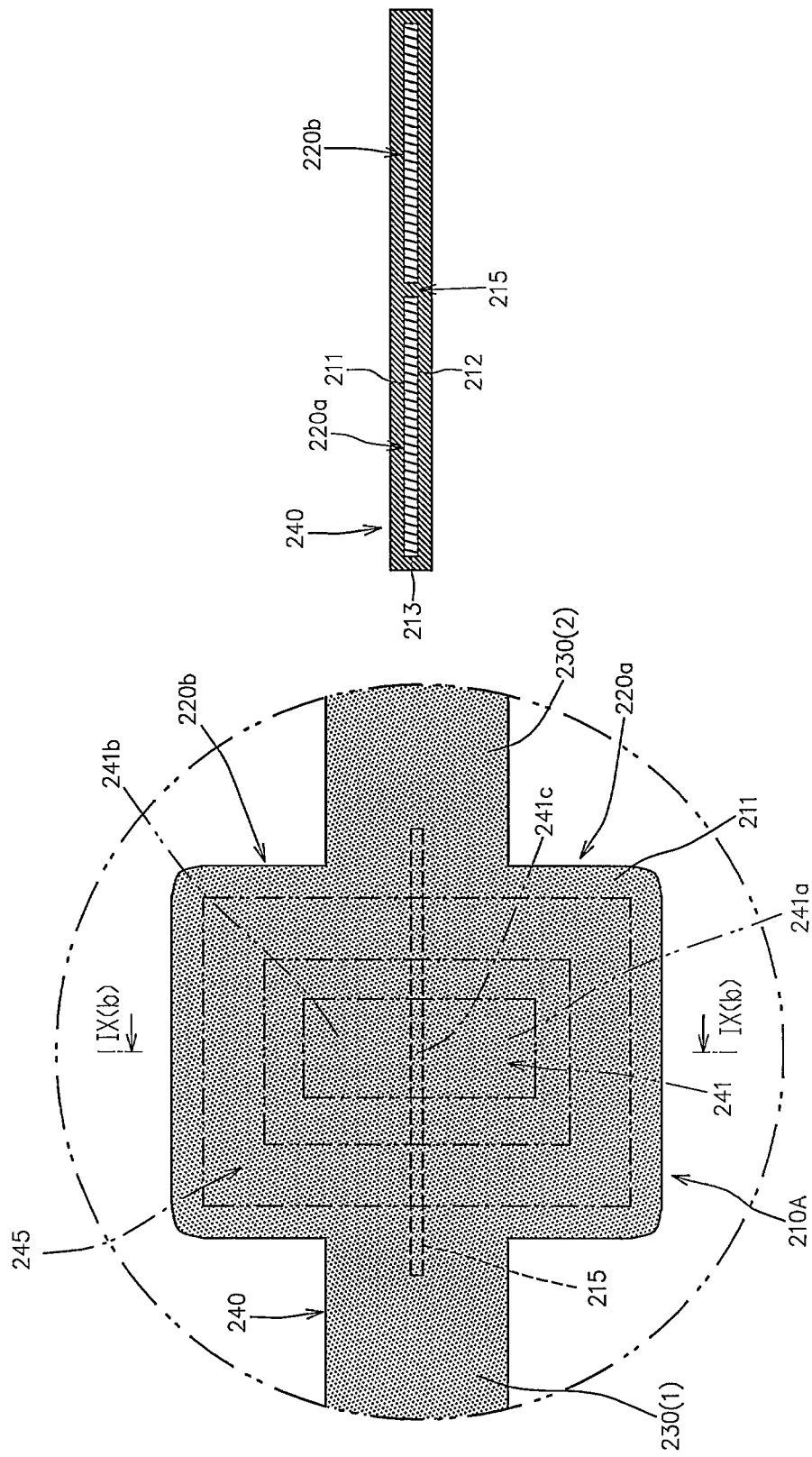
FIG. 9A is an enlarged view of the part IX(a) in FIG. 8.
FIG. 9B is a cross-sectional view along the line IX(b)-IX(b) in FIG. 9A.

FIG. 9A shows an enlarged view of the part IX(a) in FIG. 8, and FIG. 9B shows a cross-sectional view along the line IX(b)-IX(b) in FIG. 9A.

As shown in FIG. 9B, in the present embodiment, the insulative resin material 240 is provided not only in the slit 215 and on the first surface 211 of the busbar assembly formation area 210, but also on the second surface 212 and an outer peripheral surface 213 of the busbar assembly formation area 210.

The insulative resin material 240 is an insulative resin, which has heat resistance and insulative properties, such as polyimide, polyamide, epoxy, and the like, and, as described above, which becomes transparent to transmit the laser beam in the half-cured state and becomes nontransparent to absorb the laser beam in the completely cured state. Preferably, Insuleed (registered trademark) is used as the insulative resin material 240.

Provision of the insulative resin material 240 can be performed, for example, by electrodeposition coating of a paint containing the insulative resin material 240.

Instead, it is also possible to electrostatically powder-coat the insulative resin material 240.

Alternatively, in a case where the filling of the resin into the slit 215 can be sufficiently performed, it is also possible to spray the paint including the insulative resin material 240.

The first manufacturing method further includes a half-curing process of half-curing the insulative resin material 240 and a laser beam irradiation process of irradiating the half-cured insulative resin material 240 with the laser beam.

The half-curing process is performed, for example, by heat-treating the insulative resin material 240 at a predetermined temperature and for a predetermined time.

The laser beam in the above laser irradiation process is of a wavelength that pass through the insulative resin material 240 in the half-cured state, for example, a wavelength of 1064 nm.

In the laser irradiation process, as shown in FIG. 9A, the laser beam is irradiated to, out of the insulative resin material 240 on the first surface 211 of the busbar assembly formation area 210A, the first surface-side center laser area 241 including the first surface-side first center opening formation area 241a corresponding to the first surface-side first center opening 41a, the first surface-side second center opening formation area 241b corresponding to the first surface-side second center opening 41b, and the first surface-side intermediate area 241c sandwiched by the first surface-side first and second center opening formation areas 241a, 241b.

With this process, while the first surface-side intermediate area 241c is substantially left, only the areas in which the first and second busbar formation parts 220a and 220b are present directly below (i.e., the first surface-side first center opening formation area 241a and the first surface-side second center opening formation area 241b) are melted, forming the first surface-side first center opening 41a and the first surface-side second center opening 41b.

In this case, the edge of the first surface-side first center opening 41a on the side proximate to the slit 215 (gap 19) is made substantially coincident with the boundary of the first busbar formation part 220a and the slit 215 (gap 19), and the edge of the first surface-side second center opening 41b on the side proximate to the slit 215 (gap 19) is made substantially coincident with the boundary of a second busbar formation part 220b and the slit 215 (gap 19); further, the first surface-side partition wall part 42 is provided (see FIG. 3A).

In the present embodiment, the laser beam irradiation process irradiates the laser beam to a periphery opening formation area 245 that corresponds to the periphery opening 45, in addition to the first surface-side center laser area 241.

Further, in the present embodiment, the laser beam irradiation process is so configured as to also irradiate the laser beam to the second surface 212 of the busbar assembly formation area 210.

FIG. 10 shows a bottom view of the part IX(a) in FIG. 8.

In detail, out of the insulative resin material 240 on the second surface 212 of the busbar assembly formation area 210, the laser beam is irradiated to a second surface-side center laser area 251 including a second surface-side first center opening equivalent area 251a corresponding to the second surface-side first center opening 51a, a second surface-side second center opening equivalent area 251b corresponding to the second surface-side second center opening 51b, and a second surface-side intermediate area 251c sandwiched by the second surface-side first and second center opening equivalent areas 251a, 251b.

With this process, while the second surface-side intermediate area 251c is substantially left, only the areas in which the first and second busbar formation parts 220a and 220b are present directly below (i.e., the second surface-side first center opening equivalent area 251a and the second surface-side second center opening equivalent area 251b) are melted, forming the second surface-side first center opening 51a and the second surface-side second center opening 51b.

In this case, the edge of the second surface-side first center opening 51a on the side proximate to the slit 215 (gap 19) is made substantially coincident with the boundary of the first busbar formation part 220a and the slit 215 (gap 19), and the edge of the second surface-side second center opening 51b on the side proximate to the slit 215 (gap 19) is made substantially coincident with the boundary of the second busbar formation part 220b and the slit 215 (gap 19). Further, the second surface-side partition wall part 52 is provided (see FIG. 3B).

The first manufacturing method further includes a complete curing process in which the insulative resin material 240, in which a predetermined opening is provided by the laser beam irradiation process, is completely cured thereby to form the insulative resin layer 30.

The complete curing process is performed, for example, by heat-treating the insulative resin material 240 in the half-cured state at a predetermined temperature and for a predetermined time.

Figures 11A, 11B:
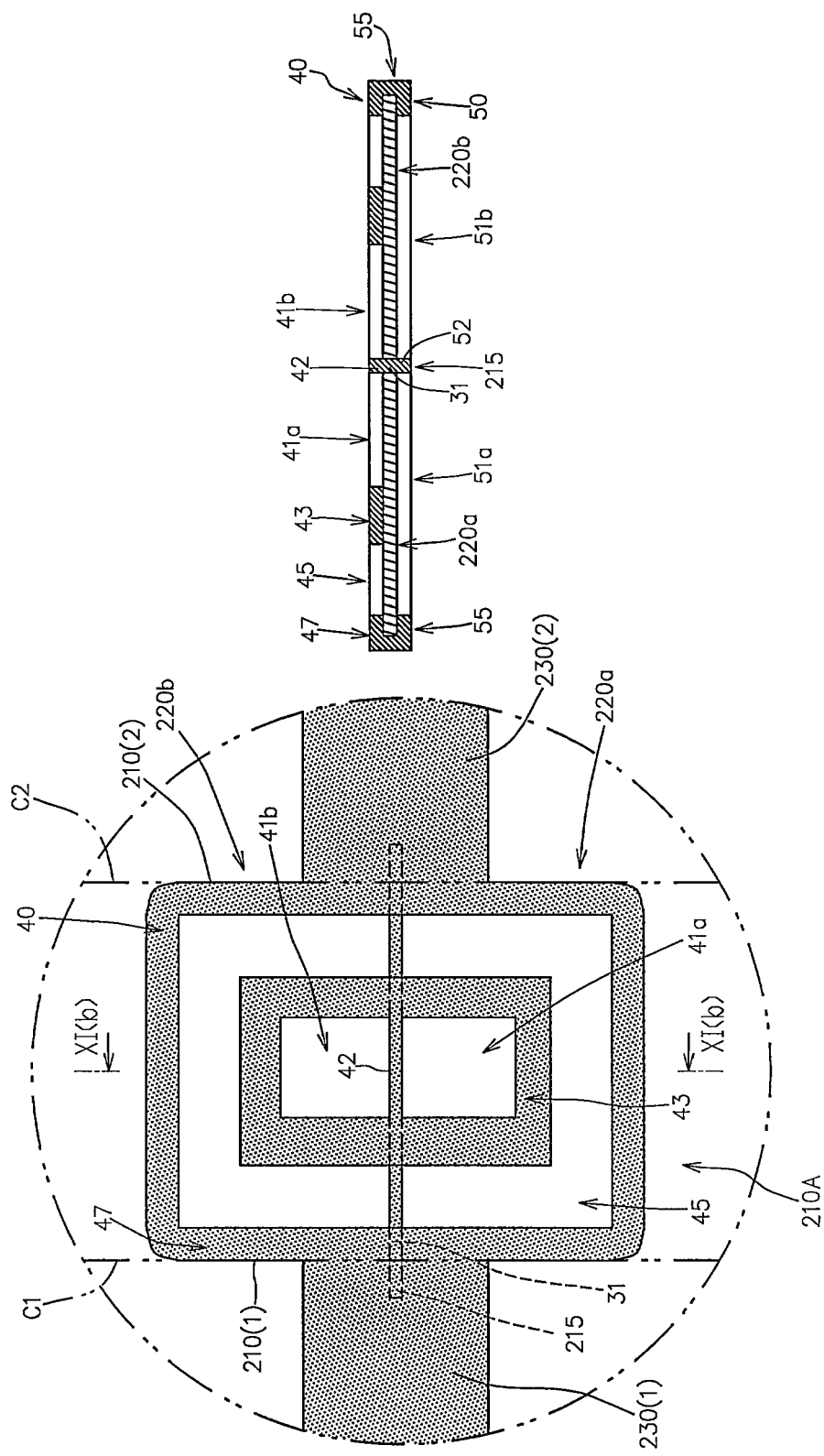
FIG. 11A is a plan view of a busbar assembly formation area of the busbar-directed conductive metal flat plate, and shows a state after a complete curing process in the first manufacturing method.
FIG. 11B is a cross-sectional view of along the line XI(b)-XI(b) in FIG. 11A.

FIG. 11A shows a plan view of the busbar assembly formation area 210A after the complete curing process, and FIG. 11B shows a cross-sectional view of along the line XI(b)-XI(b) in FIG. 11A.

The first manufacturing method can further include a plating process in which, after the complete curing process, a plating layer (not shown) is formed in exposure regions of the pair of busbar formation parts 220a and 220b.

The first manufacturing method further includes a cutting process in which the busbar assembly formation area 210 provided with the insulative resin layer 30 is cut from the busbar-directed conductive metal flat plate 200, thus taking out the busbar assembly 1.

As described above, in the present embodiment, the length of the busbar assembly formation area 210 in the X-direction is set to be the same as the busbar assembly 1's length in the direction along the gap 19, and the length of the busbar assembly formation area 210 in the Y-direction is set to be the same as the busbar assembly 1's length in the direction orthogonal to the gap 19.

On that basis, the slit 215 formed in the one busbar assembly formation area 210A has the one side in the longitudinal direction (X-direction) extending into the one connection area 230(1) connected to the one side in the longitudinal direction (X direction) of the one busbar assembly formation area 210A, and another side in the longitudinal direction (X direction) extending into the other connection area 230(2) connected to the other side in the longitudinal direction (X direction) of the one busbar assembly formation area 210A.

In this case, the cutting process, as shown in FIG. 11A, is so configured as to perform cutting at cutting lines C1 and C2 along edges 210(1) and 210(2), respectively, on one side and the other side of the busbar assembly formation area 210 in the X direction.

The thus configured manufacturing method makes it possible to efficiently manufacture the busbar assembly 1 according to the present embodiment.

That is, in the above manufacturing method, while the relative positions of the pair of busbar formation parts 220a and 220b forming the first and second busbars 10a and 10b are fixed, the slit 215 between the pair of busbar formation parts 220a and 220b is filled by the gap filling part 31, and the first surface-side laminate part 40 is provided on the first surfaces of the pair of busbar formation parts 220a and 220b, and then any unnecessary part of the first surface-side laminate part 40 is removed.

The pair of busbar formation parts 220a, 220b, which are mechanically connected to each other by the connection area 230 in this state, are cut from the busbar-directed conductive metal flat plate 200, thereby to manufacture the busbar assembly 1.

Accordingly, it is possible to efficiently and inexpensively manufacture the busbar assembly 1 in which the first and second busbars 10a, 10b are accurately positioned at the desired relative positions, while ensuring the electrical insulation property between the first and second busbars 10a, 10b.

Second Embodiment

Another embodiment of the busbar assembly according to the present invention will be described below with reference to the accompanying drawings.

FIG. 12 shows a plan view of a busbar assembly 2 according to the present embodiment.

Figure 13A:
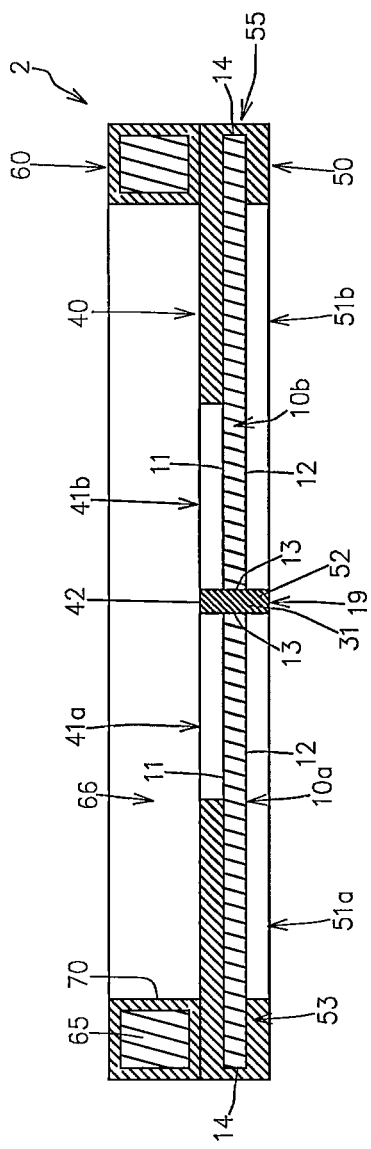
FIG. 13A is a cross-sectional view along the line XIII(a)-XIII(a) in FIG. 12.

FIG. 13A shows a cross-sectional view along the line XIII(a)-XIII(a) in FIG. 12.

Figure 13B:
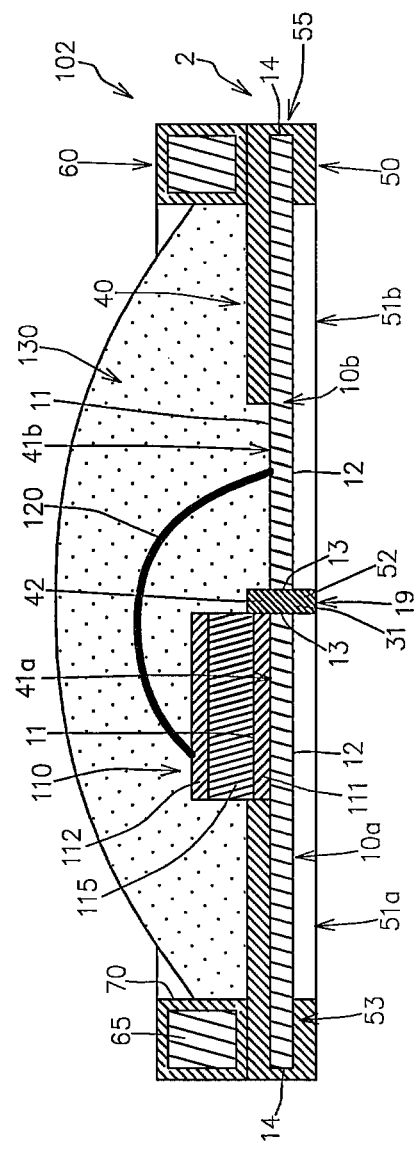
FIG. 13B is a vertical cross-sectional view of a semiconductor module in which a semiconductor element is mounted on the busbar assembly according to the second embodiment.

Further, FIG. 13B shows a vertical cross-sectional view of a semiconductor module 102 in which the semiconductor element 110 is mounted on the busbar assembly 2.

In the drawings, the same reference numerals are applied to the same components as those in the embodiment 1 above, and the description thereof will be omitted as appropriate.

The busbar assembly 2 according to the present embodiment has a configuration different from that of the busbar assembly 1 of embodiment 1 with respect to the damming structure of the sealing resin layer 130.

That is, in the busbar assembly 1 according to the above embodiment 1, the periphery opening 45 formed in the first surface-side laminate part 40 forms the damming structure.

On the other hand, as shown in FIGS. 12, 13A and 13B, the busbar assembly 2 according to the present embodiment has a frame 60 that is formed separately from the busbar connection body in which the first and second busbars 10a, 10b are connected to each other and that is firmly attached to the first surface of the busbar connection body, and the frame 60 forms the above damming structure.

In detail, the frame 60 has a cylindrical frame body 65 having a center hole 66 penetrating in the plate thickness direction of the busbar assembly 2, and a frame-side insulative resin layer 70 covering an outer peripheral surface of the frame body 65.

The frame 60 is firmly attached to the peripheral area of the first side of the busbar connection body in a state enclosing the first surface-side first center opening 41a and the first surface-side second center opening 41b in plan view.

The frame body 65 can be formed, for example, by using a metal flat plate having a thickness corresponding to the thickness of the frame body 65 and by forming the center hole 66 by press working on the metal flat plate.

The frame-side insulative resin layer 70 is formed using an insulative resin material, such as polyimide, polyamide, epoxy, and the like.

The busbar assembly 2 according to the present embodiment is manufactured, for example, by the following manufacturing method (hereinafter referred to as a second manufacturing method).

The second manufacturing method is identical with the first manufacturing method until the half-curing process.

The second manufacturing method is the same as the first manufacturing method in that the laser beam irradiation process is performed after the half-curing process, but differs from the first manufacturing method with respect to the irradiation range of the laser beam.

FIG. 14A shows an enlarged plan view of the one busbar assembly formation area 210A in the state after the half-curing process in the second manufacturing method, and FIG. 14B shows a cross-sectional view along the line XIV(b)-XIV(b) in FIG. 14A.

In the second manufacturing method, as shown in FIG. 14A, the laser beam is irradiated to only the first surface-side center laser area 241 in the first surface-side laminate part 40.

FIG. 15A shows an enlarged plan view of the one busbar assembly formation area 210A after the laser beam irradiation process, and FIG. 15B shows a cross-sectional view along the line XV(b)-XV(b) in FIG. 15A.

For the second surface-side laminate part 50, the laser beam is irradiated to the second surface-side center laser area 251 in the same manner as in the first manufacturing method.

The second manufacturing method is configured to perform a frame formation operation to form the frame 60 in parallel with or before or after an operation from the process of preparing the busbar-directed conductive metal flat plate 200 until the laser beam irradiation process.

Figure 16:
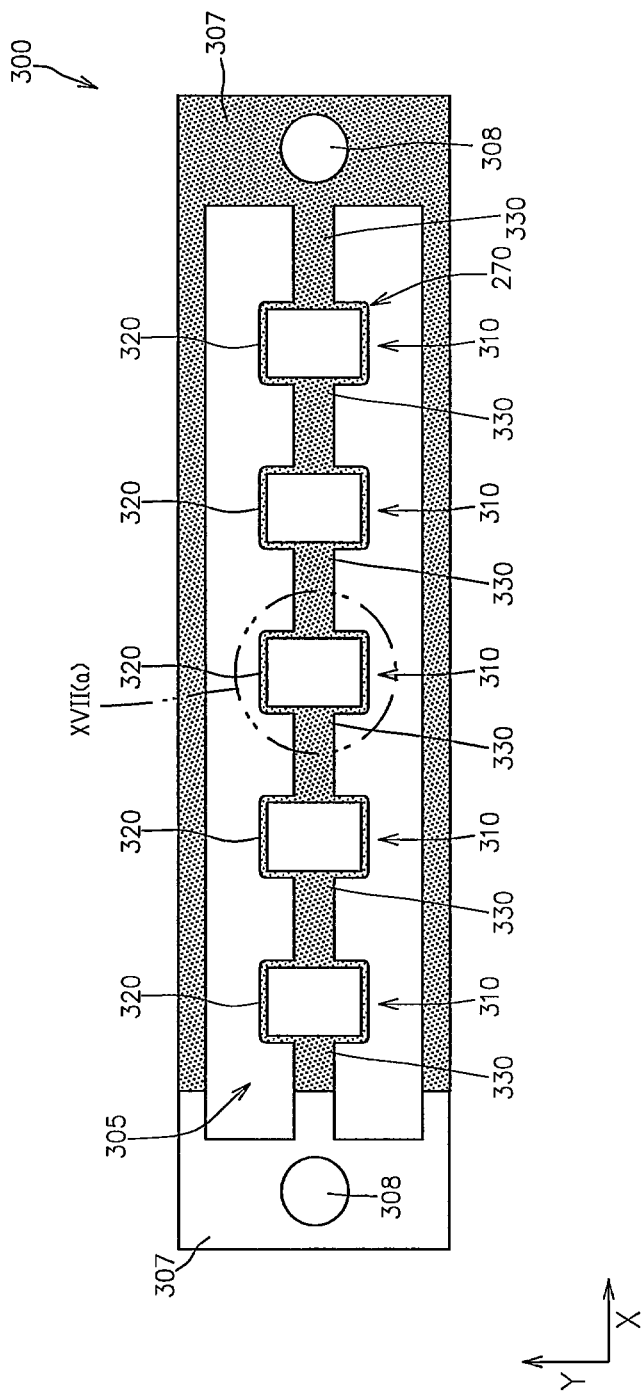
FIG. 16 is a plan view of a frame-directed conductive metal flat plate used in the second manufacturing method, FIG. 16 showing a state after a an insulative resin material provision process in the second manufacturing method.

FIG. 16 shows a plan view of a frame-directed conductive metal flat plate 300 used in the frame formation operation.

Further, FIG. 17A shows an enlarged view of the part XVII(a) in FIG. 16, and FIG. 17B shows a cross-sectional view along the line XVII(b)-XVII(b) in FIG. 17A.

Figure 17:
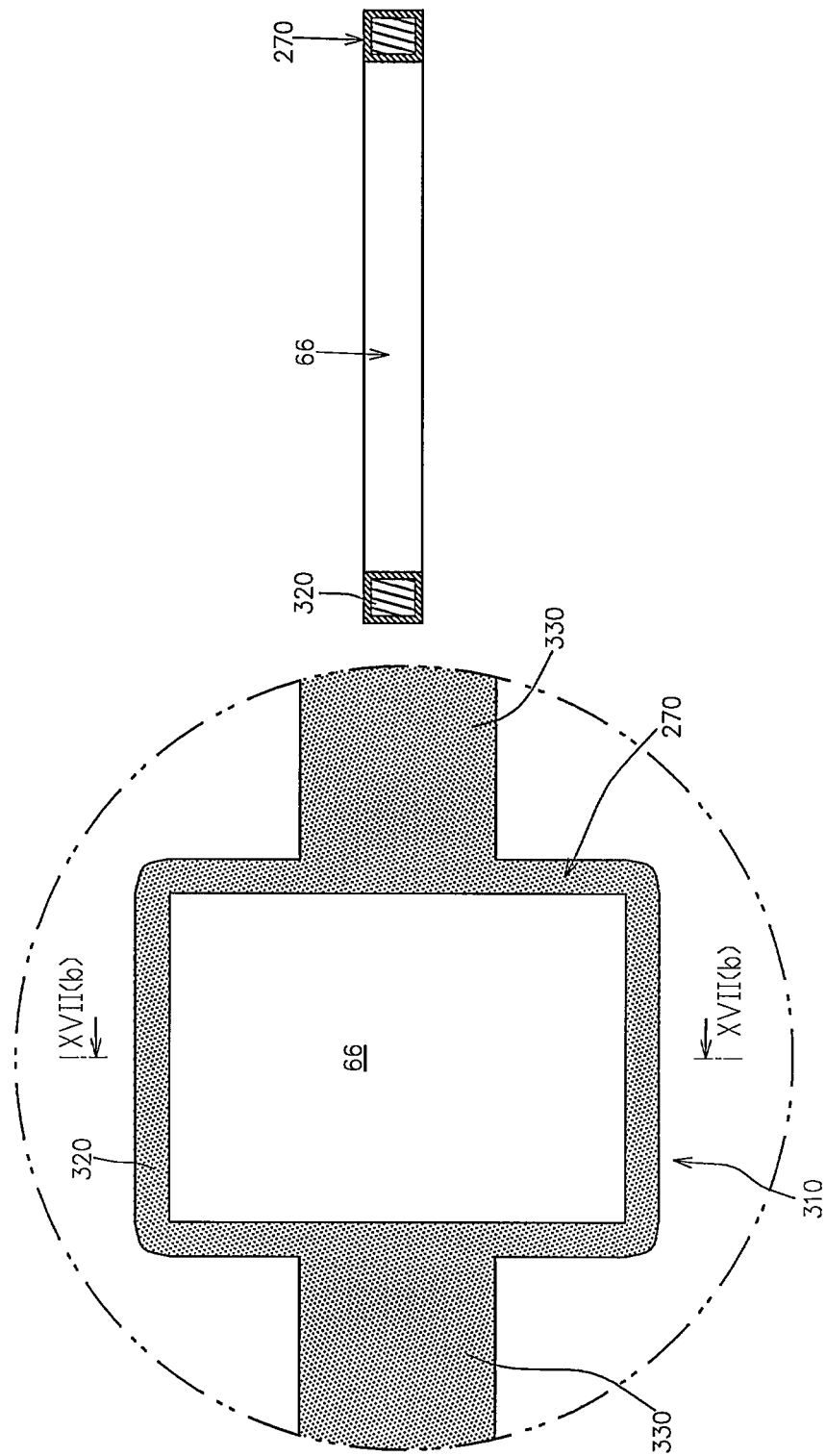
FIG. 17A is an enlarged view of the part XVII(a) in FIG. 16.
FIG. 17B is a cross-sectional view along the line XVII(b)-XVII(b) in FIG. 17A.

As shown in FIGS. 16 and 17, the frame formation operation includes: a process of preparing the frame-directed conductive metal flat plate 300 includes a frame formation area 310 that has the thickness same as the thickness of the frame body 65 and that has an outer peripheral shape corresponding to the busbar assembly formation area 210 in plan view, a process of punching out the center of the frame formation area 310 so that a frame body formation part 320 in the frame formation area 310 remains, and a process of providing an insulative resin material 270 on an outer peripheral surface of the frame body formation part 320.

FIG. 16 shows a state after the process of providing the insulative resin material 270 on the outer peripheral surface of the frame body formation part 320.

The frame-directed conductive metal flat plate 300 is configured so that, when being overlapped with the busbar-directed conductive metal flat plate 200, the frame formation area 310 is aligned with the busbar assembly formation area 210.

In detail, as described above, the busbar-directed conductive metal flat plate 200 has the busbar row 205 including the plurality of the busbar assembly formation areas 210 arranged in series along the X-direction and the connection areas 230 each connecting between busbar assembly formation areas 210 adjacent in the X-direction.

Accordingly, as shown in FIG. 16, the frame-directed conductive metal flat plate 300 having a frame row 305 that includes a plurality of the frame formation areas 310 arranged in series in the X-direction at the same pitch as the plurality of busbar assembly formation areas 210 and connection areas 330 connecting between frame formation areas 310 adjacent in the X-direction.

Further, as described above, the busbar-directed conductive metal flat plate 200 has the pair of grip pieces 207 connected to the one side and the other side in the longitudinal direction (X direction) of the busbar row 205, respectively, and the pair of grip pieces 207 are provided with positioning holes 208.

Accordingly, as shown in FIG. 16, the frame-directed conductive metal flat plate 300 is also provided with a pair of grip pieces 307 connected to the one side and the other side in the longitudinal direction (X direction) of the frame row 305, respectively, and the pair of grip pieces 307 are provided with positioning holes 308 that correspond to the positioning holes 208.

In the punching process, the center hole 66 is formed so that the frame body formation part 320 surrounds the first surface-side first center opening 41a and the first surface-side second center opening 41b when the frame formation area 310 is overlapped with the busbar assembly formation area 210.

Provision of the insulative resin material 270 on the frame body formation part 320 can be performed, for example, by electrodeposition coating of a paint containing an insulative resin, which has heat resistance and insulation properties, such as polyimide, polyamide, epoxy, and the like.

Instead, it is also possible to electrostatically powder-coat the insulative resin material 270.

Alternatively, it is also possible to spray the paint containing the insulative resin material 270.

Preferably, the process of providing the insulative resin material 270 on the frame body formation part 320 can be performed simultaneously with and in the same manner as the process of providing the insulative resin material 240 on the busbar assembly formation area 210.

That is, in the case of providing the insulative resin material 240 on the busbar assembly formation area 210 by electrodeposition coating, the insulative resin material 270 can be provided on the frame body formation part 320 as well by the electrodeposition coating, and in the case of providing the insulative resin material 240 on the busbar assembly formation area 210 by the electrostatic powder coating, the insulative resin material 270 can be provided on the frame body formation part 320 as well by the electrostatic powder coating.

According to this configuration, the manufacturing efficiency can be improved.

The second manufacturing method includes an assembling process that includes overlapping both the metal flat plates 200 and 300 in the state in which at least one of the insulative resin material 240 remained on the busbar-directed conductive metal flat plate 200 obtained after the laser beam irradiation process, and the insulative resin material 270 provided on the frame-directed conductive metal flat plate 300 is half-cured, then completely curing the insulative resin material in the half-cured state, and thereby firmly attaching both the metal flat plates 200 and 300.

Figure 18:
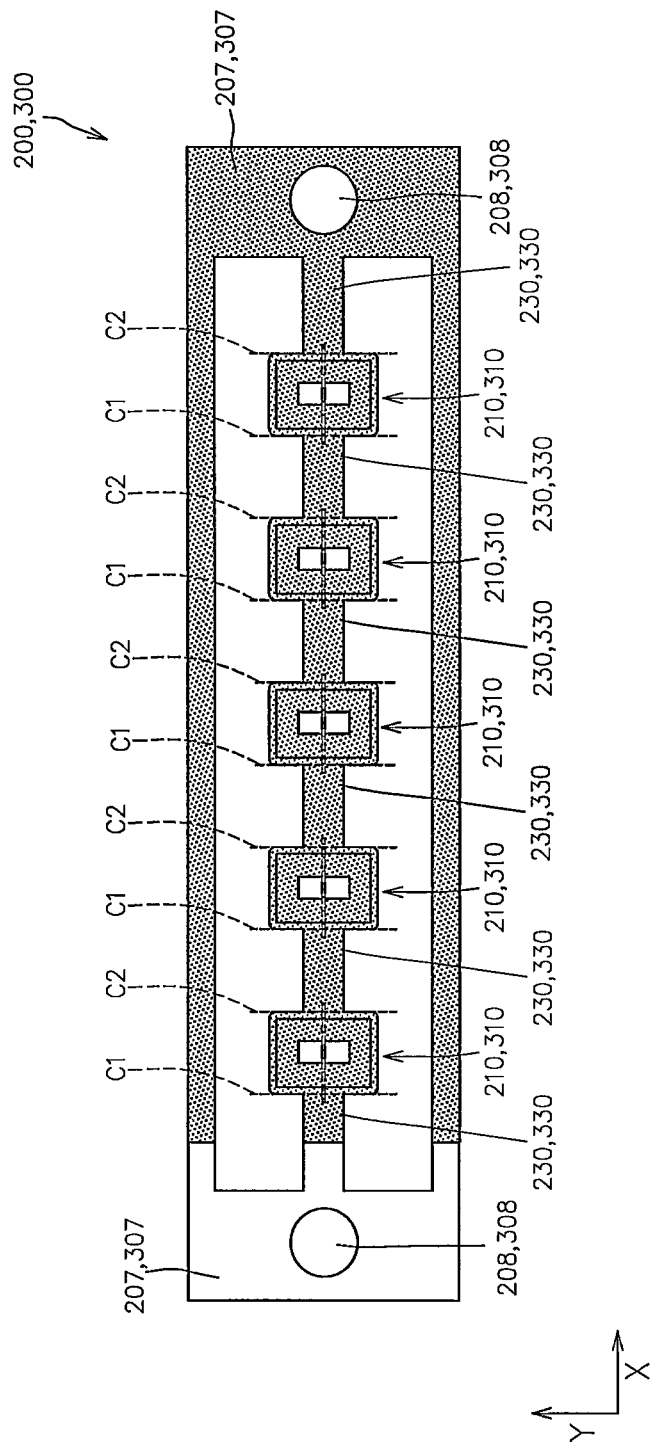
FIG. 18 is a plan view of the busbar-directed conductive metal flat plate and the frame-directed conductive metal flat plate after an assembling process in the second manufacturing method.
Figure 19A:
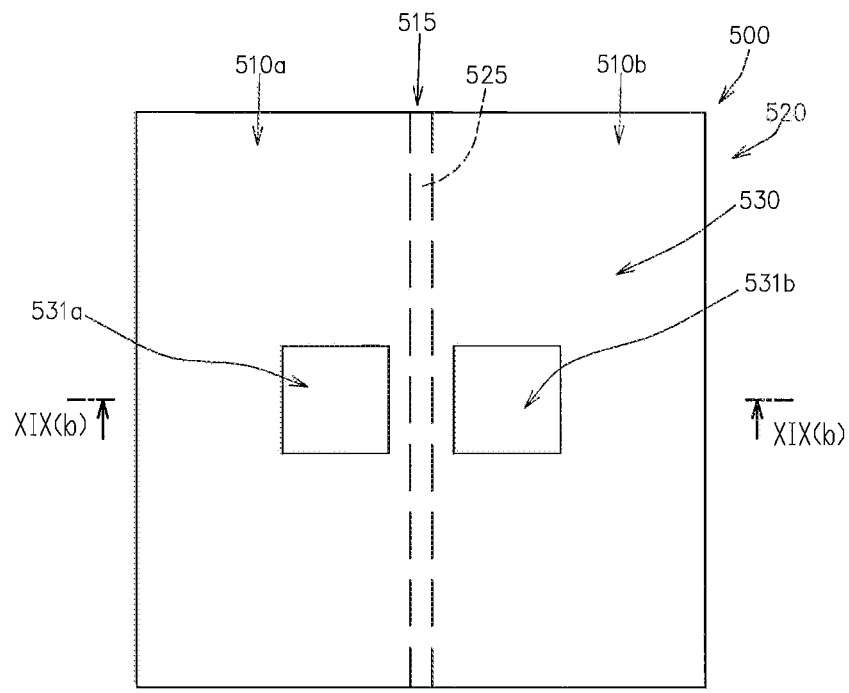
FIG. 19A is a plan view of a conventional planar-type busbar assembly.
Figure 19B:
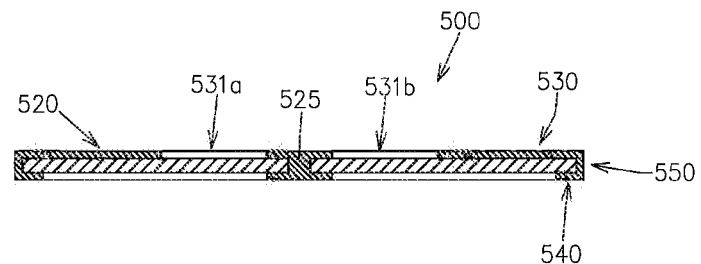
FIG. 19B is a cross-sectional view along the line XIX(b)-XIX(b) in FIG. 19A
Figure 19C:
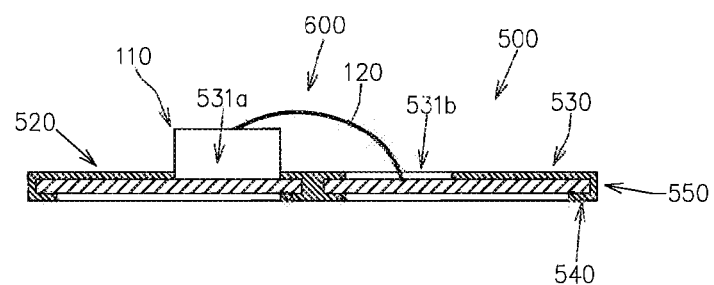
FIG. 19C is a vertical cross-sectional view of a semiconductor module in which a semiconductor element is mounted on the conventional busbar assembly.
Figure 20A:
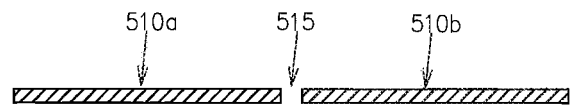
FIGS. 20A to 20D are process flow charts of a manufacturing method of the conventional planar-type busbar assembly.
Figure 20B:
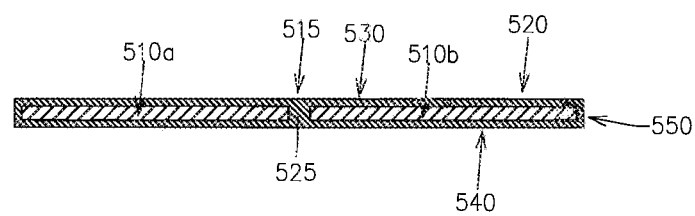
Figure 20C:
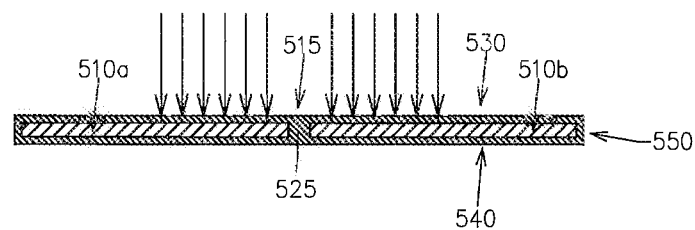
Figure 20D:
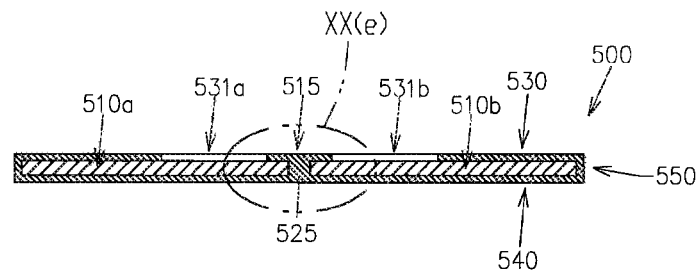
Figure 20E:
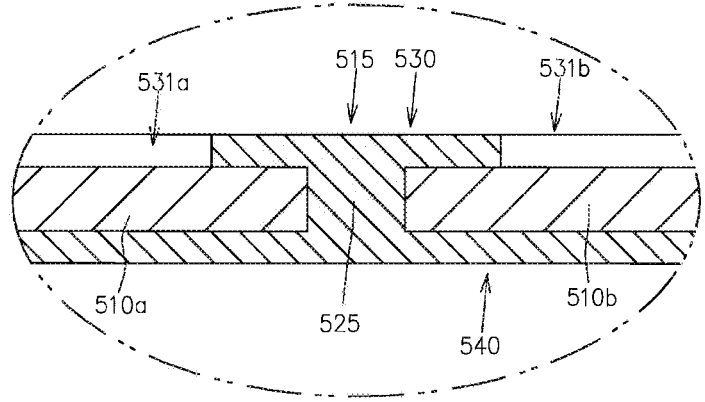
FIG. 20E is an enlarged view of the part XX(e) in FIG. 20D.
Figure 21A:
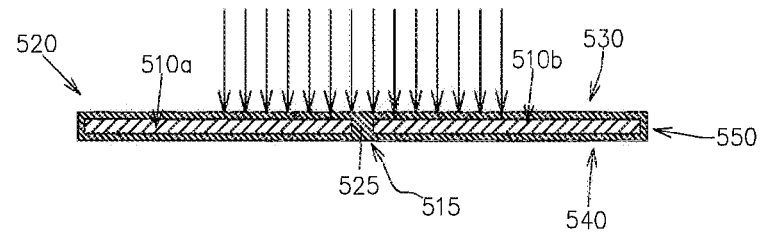
FIG. 21A is a cross-sectional view showing a laser beam irradiation process in the manufacturing method of the conventional planar-type busbar assembly.
Figure 21B:
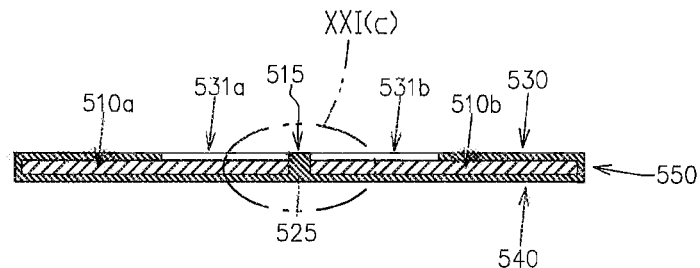
FIG. 21B is a cross-sectional view after the laser beam irradiation process.
Figure 21C:
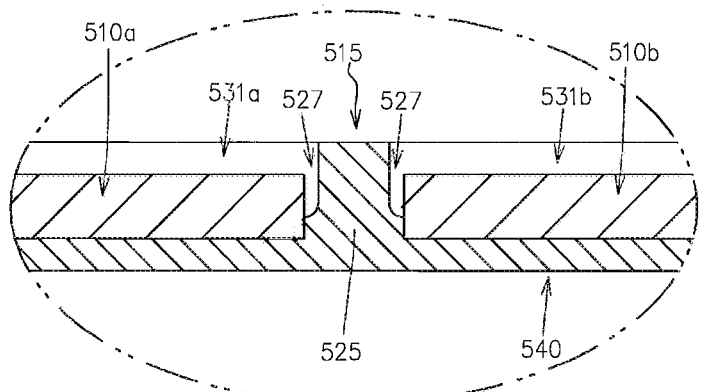
FIG. 21C is an enlarged view of the part XXI(c) in FIG. 21B.

FIG. 18 shows a plan view of the busbar-directed conductive metal flat plate 200 and the frame-directed conductive metal flat plate 300 after the above assembling process.

Instead of overlapping both the metal flat plates 200 and 300 in the state in which at least one of the insulative resin materials 240 and 270 of the busbar-directed conductive metal flat plate 200 and the frame-directed conductive metal flat plate 300 is half-cured, it is possible to firmly attach both the metal flat plates 200 and 300 by an adhesive after completely curing the insulative resin materials 240 remained on the busbar-directed conductive metal flat plate 200 after the laser beam irradiation process and 270, and the insulative resin material 270 provided on the frame-directed conductive metal flat plate 300.

As shown in FIG. 18, the second manufacturing method, after the assembling process, has a cutting process in which the busbar assembly formation area 210 and the frame formation area 310 in the overlapped state are cut at the cutting lines C1 and C2, and taken out from the busbar-directed conductive metal flat plate 200 and the frame-directed conductive metal flat plate 300.

In each of the above embodiments, the insulative resin layer 30 provided on the busbar connection body is formed by the insulative resin material 240 that is transparent in the half-cured state and nontransparent in the completely cured state; alternatively, however, it is also possible to form the insulative resin layer 30 using an insulative resin material that is transparent in the completely cured state.

In this case, the laser beam irradiation process can be performed after the insulative resin material has been completely cured.

As a matter of course, even in the case in which the insulative resin layer 30 is formed by the insulative resin material that becomes transparent in the completely cured state, it is also possible to perform the laser beam irradiation process when the insulative resin material is in the half-cured state.

In each of the above embodiments, the case in which two busbars, first and second busbars 10a and 10b, are arranged in parallel has been described as an example, but the present invention is not limited to such a configuration, and includes cases in which three or more busbars are arranged in parallel.

DESCRIPTION OF THE REFERENCE NUMERALS 1, 2 busbar assembly
10a, 10b first and second busbars
19 gap
30 insulative resin layer
31 gap filling part
40 first surface-side laminate part
41a, 41b first surface-side first and second center openings
42 partition wall part
43 center covering area
45 periphery opening
47 first surface-side periphery covering area
50 second surface-side laminate part
51a, 51b second surface-side first and second center openings
52 second surface-side partition wall part
55 side surface-side laminate part
60 frame
65 frame body
66 center hole
70 frame-side insulative resin layer
200 busbar-directed conductive metal flat plate
210 busbar assembly formation area
215 slit
230 connection area
240 insulative resin material
241 first surface-side center laser area
241a, 241b first surface-side first and second center opening formation areas
241c first surface-side intermediate area
245 periphery opening formation area
270 insulative resin material
300 frame-directed conductive metal flat plate
310 frame formation area
320 frame body formation part

The invention claimed is:

1. A busbar assembly comprising:
a plurality of busbars each formed by a conductive flat plate member and disposed in a common plane with a gap provided between adjacent busbars;
an insulative resin layer including a gap filling part filled into the gap and a first surface-side laminate part provided on a first surface on one side in a plate thickness direction of a busbar connection body in which the plurality of busbars are connected to one another by the gap filling part;
the first surface-side laminate part having a plurality of first surface-side center openings that expose predetermined parts of the first surfaces of the plurality of busbars, respectively, to form a plurality of exposure regions;

the insulative resin layer being formed by an insulative resin material that is transparent in a half-cured state and nontransparent in a completely cured state; and a frame that includes a cylindrical frame body with a center hole and a second insulative resin layer covering an outer peripheral surface of the frame body, wherein the frame is fixed to a peripheral area of the first surface of the busbar connection body so as to surround the plurality of first surface-side center openings in plan view.

2. The busbar assembly according to claim 1, wherein each edge of the plurality of first surface-side center openings on a side proximate to the corresponding gap is aligned with a boundary between the corresponding busbar and the corresponding gap.

3. The busbar assembly according to claim 1, wherein the first surface-side laminate part has a partition wall part extending from the gap filling part outward toward one side in the plate thickness direction of the busbar connection body at an area sandwiched by the plurality of first surface-side center openings that are adjacent to each other with the gap being sandwiched therebetween.

4. The busbar assembly according to claim 1, wherein the first surface-side laminate part has a center covering area that covers the first surface of the busbar connection body at an area surrounding the plurality of first surface-side center openings in plan view, a periphery opening that exposes the first surface of the busbar connection body at an area surrounding the center covering area, and a periphery covering area that covers the first surface of the busbar connection body at an area surrounding the periphery opening in plan view.

5. The busbar assembly according to claim 1, wherein the insulative resin layer has a second surface-side laminate part provided on a second surface on an other side of the busbar connection body in the plate thickness direction, and a side surface-side laminate part provided on a side surface of the busbar connection body and connecting the first and second surface-side laminate parts, and wherein the second surface-side laminate part has a plurality of second surface-side center openings that expose predetermined parts of second surfaces of the plurality of busbars, respectively, to form a plurality of exposure regions.

6. The busbar assembly according to claim 5, wherein each edge of the plurality of second surface-side center openings on a side proximate to the corresponding gap is aligned with a boundary between the corresponding busbar and the corresponding gap.

7. The busbar assembly according to claim 5, wherein the second surface-side laminate part has a partition wall part extending from the gap filling part outward toward the other side in the plate thickness direction of the busbar connection body at an area sandwiched by the second surface-side center openings that are adjacent to each other with the gap being sandwiched therebetween.

8. A busbar assembly comprising:

a plurality of busbars each formed by a conductive flat plate member and disposed in a common plane with a gap provided between adjacent busbars;

an insulative resin layer including a gap filling part filled into the gap and a first surface-side laminate part provided on a first surface on one side in a plate thickness direction of a busbar connection body in which the plurality of busbars are connected to one another by the gap filling part;

the first surface-side laminate part having a plurality of first surface-side center openings that expose predetermined parts of the first surfaces of the plurality of busbars, respectively, to form a plurality of exposure regions; and the first surface-side laminate part having a partition wall part extending from the gap filling part outward toward one side in the plate thickness direction of the busbar connection body at an area sandwiched by the first surface-side center openings that are adjacent to each other with the gap being sandwiched therebetween, the partition wall having a surface aligned with an edge of one of the plurality of busbars, the surface configured to act as a stopper to align a semiconductor element.

9. A busbar assembly comprising:

a plurality of busbars each formed by a conductive flat plate member and disposed in a common plane with a gap provided between adjacent busbars;

an insulative resin layer including a gap filling part filled into the gap and a first surface-side laminate part provided on a first surface on one side in a plate thickness direction of a busbar connection body in which the plurality of busbars are connected to one another by the gap filling part;

the first surface-side laminate part having a plurality of first surface-side center openings that expose predetermined parts of first surfaces of the plurality of busbars, respectively, to form a plurality of exposure regions;

the insulative resin layer being formed by an insulative resin material that is nontransparent in a completely cured state, and a frame that includes a cylindrical frame body with a center hole and a second insulative resin layer covering an outer peripheral surface of the frame body, wherein the frame is fixed to a peripheral area of the first surface of the busbar connection body so as to surround the plurality of first surface-side center openings in plan view.

10. A method for manufacturing a busbar assembly including a plurality of busbars each formed by a conductive flat plate member and disposed in a common plane with a gap provided between adjacent busbars, and an insulative resin layer including a gap filling part filled into the gap and a first surface-side laminate part provided on a first surface on one side in a plate thickness direction of a busbar connection body in which the plurality of busbars are connected to one another by the gap filling part, wherein the first surface-side laminate part has a plurality of first surface-side center openings that expose predetermined parts of the first surfaces of the plurality of busbars, respectively, to form a plurality of exposure regions, the method comprising:

a process of preparing a conductive metal flat plate having a busbar assembly formation area that forms the plurality of busbars;

a slit formation process of forming, in the busbar assembly formation area, one or more slits penetrating between a first surface on one side and a second surface on the other side in the plate thickness direction and having a width same as the gap so as to define a plurality of busbar formation parts corresponding to the plurality of busbars;

a process of providing an insulative resin material in the one or more slits and on an entirety of the first surface of the busbar assembly formation area, wherein the insulative resin material is transparent in a half-cured state and nontransparent in a completely cured state;

a half-curing process of half-curing the insulative resin material;

a laser beam irradiation process of irradiating a laser beam to the half-cured insulative resin material at a center laser area to form first surface-side first and second center openings, wherein the center laser area includes a first center opening formation area corresponding to the first surface-side first center opening that exposes the predetermined part of the first surface of a first busbar that is one of the busbars adjacent to each other with the gap being sandwiched therebetween, a second center opening formation area corresponding to the first surface-side second center opening that exposes the predetermined part of the first surface of a second busbar that is the other one of the busbars adjacent to each other with the gap being sandwiched therebetween, and an intermediate area sandwiched between the first and second center opening formation areas;

a complete curing process of completely curing the half-cured insulative resin material; and a cutting process of cutting the busbar assembly formation area from the conductive metal flat plate.

11. The method for manufacturing the busbar assembly according to claim 10, wherein the first surface-side laminate part has a center covering area that covers the first surface of the busbar connection body at an area surrounding the plurality of first surface-side center openings in plan view, a periphery opening that exposes the first surface of the busbar connection body at an area surrounding the center covering area, and a periphery covering area that covers the first surface of the busbar connection body at an area surrounding the periphery opening in plan view, and wherein the laser beam irradiation process irradiates the laser beam to a periphery opening formation area that corresponds to the periphery opening to form the periphery opening, in addition to the center laser area.

12. The method for manufacturing the busbar assembly according to claim 10, wherein the conductive metal flat plate integrally has a plurality of busbar assembly formation areas arranged in series in a first direction along a longitudinal direction of the one or more slits, and a connection area connecting between adjacent busbar assembly formation areas, and wherein the one or more slits formed in one busbar assembly formation area has one side in the longitudinal direction extending into one connection area connected to the one side in the first direction of the one busbar assembly formation area, and another side in the longitudinal direction extending into another connection area connected to another side in the first direction of the one busbar assembly formation area.

13. A method for manufacturing a busbar assembly including a plurality of busbars each formed by a conductive flat plate member and disposed in a common plane with a gap provided between adjacent busbars, an insulative resin layer including a gap filling part filled into the gap and a first surface-side laminate part provided on a first surface on one side in a plate thickness direction of a busbar connection body in which the plurality of busbars are connected to one another by the gap filling part, and a frame fixed to a peripheral area of the first surface of the busbar connection body, wherein the first surface-side laminate part has a plurality of first surface-side center openings that expose predetermined parts of the first surfaces of the plurality of busbars, respectively, to form a plurality of exposure regions, wherein the frame has a cylindrical frame body having a center hole and an insulative resin layer covering an outer peripheral surface of the frame body, and is fixed to the peripheral area of the first surface of the busbar connection body so as to surround the plurality of first surface-side center openings in plan view, the method comprising:

a process of preparing a busbar-directed conductive metal flat plate having a busbar assembly formation area that forms the plurality of busbars;

a slit formation process of forming, in the busbar assembly formation area, one or more slits penetrating between a first surface on one side and a second surface on the other side in the plate thickness direction and having a width same as the gap so as to define a plurality of busbar formation parts corresponding to the plurality of busbars;

a process of providing an insulative resin material in the one or more slits and on an entirety of the first surface of the busbar assembly formation area, wherein the insulative resin material is transparent in a half-cured state and nontransparent in a completely cured state;

a half-curing process of half-curing the insulative resin material;

a laser beam irradiation process of irradiating a laser beam to the half-cured insulative resin material at a center laser area to form first surface-side first and second center openings, wherein the center laser area includes a first center opening formation area corresponding to the first surface-side first center opening that exposes the predetermined part of the first surface of a first busbar that is one of the busbars adjacent to each other with the gap being sandwiched therebetween, a second center opening formation area corresponding to the first surface-side second center opening that exposes the predetermined part of the first surface of a second busbar that is the other one of the busbars adjacent to each other with the gap being sandwiched therebetween, and an intermediate area sandwiched between the first and second center opening formation areas;

a frame formation operation that is performed in parallel with or before or after an operation from the process of preparing the busbar-directed conductive metal flat plate until the laser beam irradiation process, wherein the frame formation operation includes a process of preparing a frame-directed conductive metal flat plate having a frame formation area that has a thickness same as that of the frame body and that has an outer peripheral shape corresponding to the busbar assembly formation area in plan view, a process of punching out a center of the frame formation area to form a frame body formation part corresponding to the frame body, and a process of providing an insulative resin material on an outer peripheral surface of the frame body formation part;

an assembling process of overlapping the busbar-directed conductive metal flat plate and the frame-directed conductive metal flat plate with each other in the state in which at least one of the insulative resin material remained on the busbar-directed conductive metal flat plate after the laser beam irradiation process and the insulative resin material provided on the frame-directed conductive metal flat plate is half-cured, and then completely curing the insulative resin material in the half-cured state to have the metal flat plates fixed to each other; and a cutting process of cutting the busbar assembly formation area and the frame formation area that are overlapped with each other from the busbar-directed conductive metal flat plate and the frame-directed conductive metal flat plate after the assembling process.

14. The method for manufacturing the busbar assembly according to claim 13,
wherein the busbar-directed conductive metal flat plate integrally has a plurality of the busbar assembly formation areas arranged in series in a first direction along a longitudinal direction of the one or more slits, and a connection area connecting between adjacent busbar assembly formation areas,
wherein the frame-directed conductive metal flat plate integrally has a plurality of the frame formation areas arranged so as to correspond to the plurality of busbar assembly formation areas of the busbar-directed conductive metal flat plate and a connection area connecting between adjacent frame formation areas, and
wherein the one or more slits formed in one busbar assembly formation area has one side in the longitudinal direction extending into one connection area connected to the one side in the first direction of the one busbar assembly formation area, and another side in the longitudinal direction extending into another connection area connected to another side in the first direction of the one busbar assembly formation area.

15. A method for manufacturing a busbar assembly including a plurality of busbars each formed by a conductive flat plate member and disposed in a common plane with a gap provided between adjacent busbars, a busbar-side insulative resin layer including a gap filling part filled into the gap and a first surface-side laminate part provided on a first surface on one side in a plate thickness direction of a busbar connection body in which the plurality of busbars are connected to one another by the gap filling part, and a frame fixed to a peripheral area of the first surface of the busbar connection body, wherein the first surface-side laminate part has a plurality of first surface-side center openings that expose predetermined parts of the first surfaces of the plurality of busbars, respectively, to form a plurality of exposure regions, wherein the frame has a cylindrical frame body having a center hole and a frame-side insulative resin layer covering an outer peripheral surface of the frame body, and is fixed to the peripheral area of the first surface of the busbar connection body so as to surround the plurality of first surface-side center openings in plan view, the method comprising:
a process of preparing a busbar-directed conductive metal flat plate having a busbar assembly formation area that forms the plurality of busbars;
a slit formation process of forming, in the busbar assembly formation area, one or more slits penetrating between a first surface on one side and a second surface on the other side in the plate thickness direction and having a width same as the gap so as to define a plurality of busbar formation parts corresponding to the plurality of busbars;
a process of providing an insulative resin material in the one or more slits and on an entirety of the first surface of the busbar assembly formation area, wherein the insulative resin material is transparent in a half-cured state and nontransparent in a completely cured state;
a half-curing process of half-curing the insulative resin material;
a laser beam irradiation process of irradiating a laser beam to the half-cured insulative resin material at a center laser area to form first surface-side first and second center openings, wherein the center laser area includes a first center opening formation area corresponding to the first surface-side first center opening that exposes the predetermined part of the first surface of a first busbar that is one of the busbars adjacent to each other with the gap being sandwiched therebetween, a second center opening formation area corresponding to the first surface-side second center opening that exposes the predetermined part of the first surface of a second busbar that is the other one of the busbars adjacent to each other with the gap being sandwiched therebetween, and an intermediate area sandwiched between the first and second center opening formation areas;
a process of completely curing the insulative resin material remained on the busbar-directed conductive metal flat plate after the laser beam irradiation process to form the busbar-side insulative resin layer;
a frame formation operation that is performed in parallel with or before or after an operation from the process of preparing the busbar-directed conductive metal flat plate until the process of completely curing the insulative resin material remained on the busbar-directed conductive metal flat plate, wherein the frame formation operation includes a process of preparing a frame-directed conductive metal flat plate having a frame formation area that has a thickness same as that of the frame body and that has an outer peripheral shape corresponding to the busbar assembly formation area in plan view, a process of punching out a center of the frame formation area to form a frame body formation part corresponding to the frame body, a process of providing an insulative resin material on an outer peripheral surface of the frame body formation part, and a process of completely curing the insulative resin material provided on the frame body formation part to form the frame-side insulative resin layer;
an assembling process of having the busbar-directed conductive metal flat plate and the frame-directed conductive metal flat plate fixed to each other via an adhesive so that both the conductive metal flat plates are overlapped with each other; and
a cutting process of cutting the busbar assembly formation area and the frame formation area that are overlapped with each other from the busbar-directed conductive metal flat plate and the frame-directed conductive metal flat plate after the assembling process.

* * * * *